United States Patent
Chang et al.

(10) Patent No.: US 12,009,405 B2
(45) Date of Patent: Jun. 11, 2024

(54) DEEP TRENCH CAPACITOR INCLUDING A COMPACT CONTACT REGION AND METHODS OF FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW); Chien-Chang Lee, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 314 days.

(21) Appl. No.: 17/460,178

(22) Filed: Aug. 28, 2021

(65) Prior Publication Data
US 2023/0069774 A1   Mar. 2, 2023

(51) Int. Cl.
  *H01L 29/66* (2006.01)
  *H01G 2/02* (2006.01)
  *H01G 7/02* (2006.01)

(52) U.S. Cl.
  CPC ......... *H01L 29/66181* (2013.01); *H01G 2/02* (2013.01); *H01G 7/021* (2013.01)

(58) Field of Classification Search
  CPC ........ H01G 2/00–065; H01L 28/90–92; H01L 28/75; H01L 28/40; H01L 29/66181; H01L 29/94–945
  See application file for complete search history.

(56) References Cited

U.S. PATENT DOCUMENTS

| | | | | |
|---|---|---|---|---|
| 6,437,385 B1* | 8/2002 | Bertin | ..................... | H01L 28/87 257/E21.651 |
| 2012/0061798 A1* | 3/2012 | Wong | .................... | H01L 29/945 257/532 |
| 2013/0161792 A1* | 6/2013 | Tran | ........................ | H01L 29/92 438/386 |
| 2014/0110823 A1* | 4/2014 | Chou | .................... | H01L 29/945 257/532 |
| 2014/0120690 A1* | 5/2014 | Weng | ................ | H01L 29/66181 438/387 |
| 2014/0374880 A1* | 12/2014 | Chen | ........................ | H01L 28/40 257/532 |
| 2015/0145103 A1* | 5/2015 | Chou | .................... | H01L 21/822 438/387 |
| 2020/0176552 A1* | 6/2020 | Chang | ................. | H01L 23/5329 |

* cited by examiner

*Primary Examiner* — Steven M Christopher
*Assistant Examiner* — Tyler J Wiegand
(74) *Attorney, Agent, or Firm* — The Marbury Law Group, PLLC

(57) ABSTRACT

A deep trench capacitor includes at least one deep trench and a layer stack including at least three metallic electrode layers interlaced with at least two node dielectric layers and continuously extending over the top surface of a substrate and into each of the at least one deep trench. A contact-level dielectric layer overlies the substrate and the layer stack. Contact assemblies extend through the contact-level dielectric layer. A subset of the contact assemblies vertically extend through a respective metallic electrode layer. For example, a first contact assembly includes a first tubular insulating spacer that laterally surrounds a first contact via structure and contacts a cylindrical sidewall of a topmost metallic electrode layer.

20 Claims, 14 Drawing Sheets

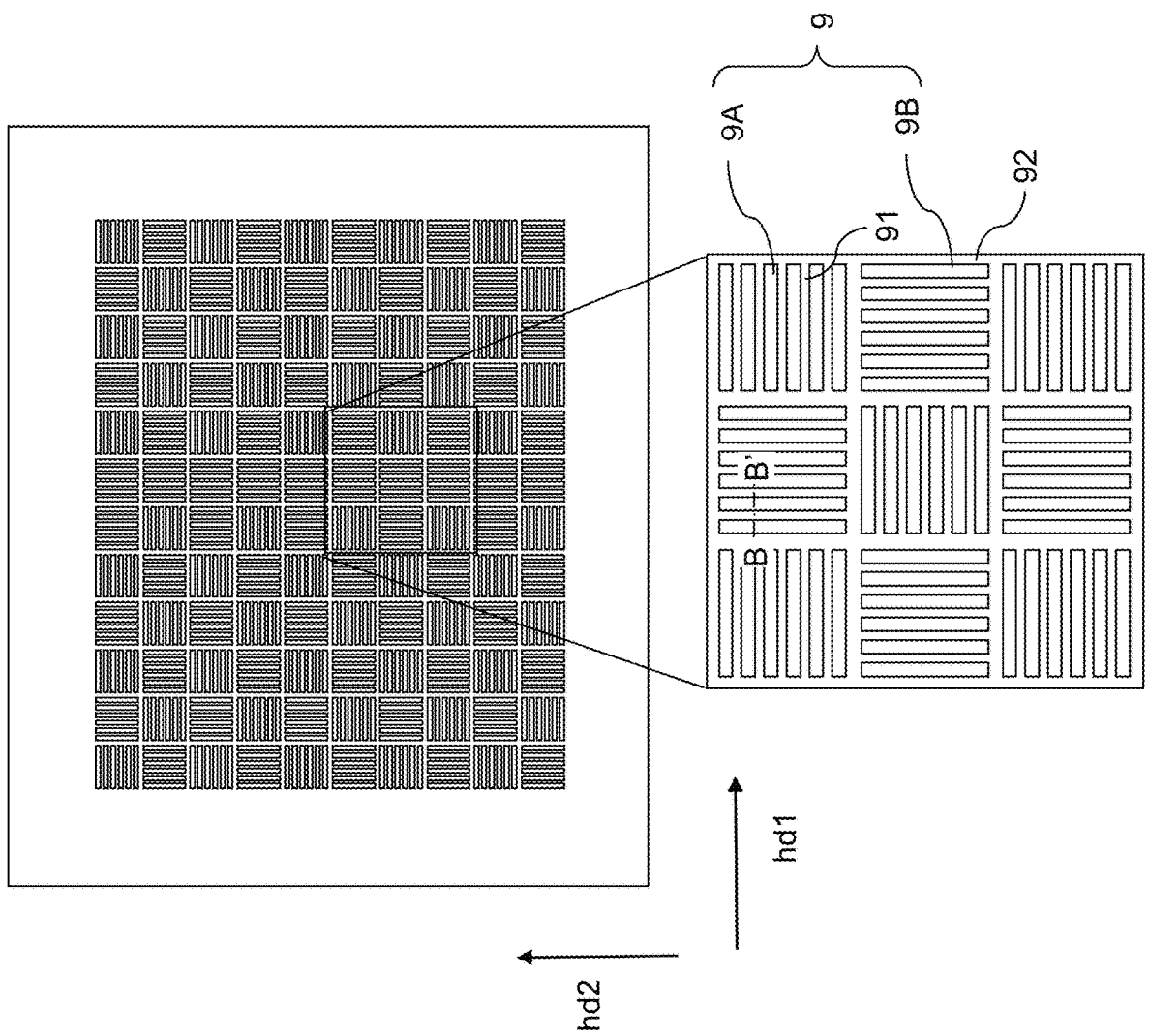

DEEP TRENCH CAPACITOR INCLUDING A COMPACT CONTACT REGION AND METHODS OF FORMING THE SAME

BACKGROUND

Capacitors are used in semiconductor chips for many applications such as power supply stabilization. However, a significant amount of device area is often used to fabricate such capacitors. Accordingly, capacitors that may provide high capacitance with a small device footprint are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of an exemplary structure after formation of deep trenches into a substrate according to an embodiment of the present disclosure. An inset illustrates a magnified view of a portion of the exemplary structure.

DETAILED DESCRIPTION

Figure 1B:
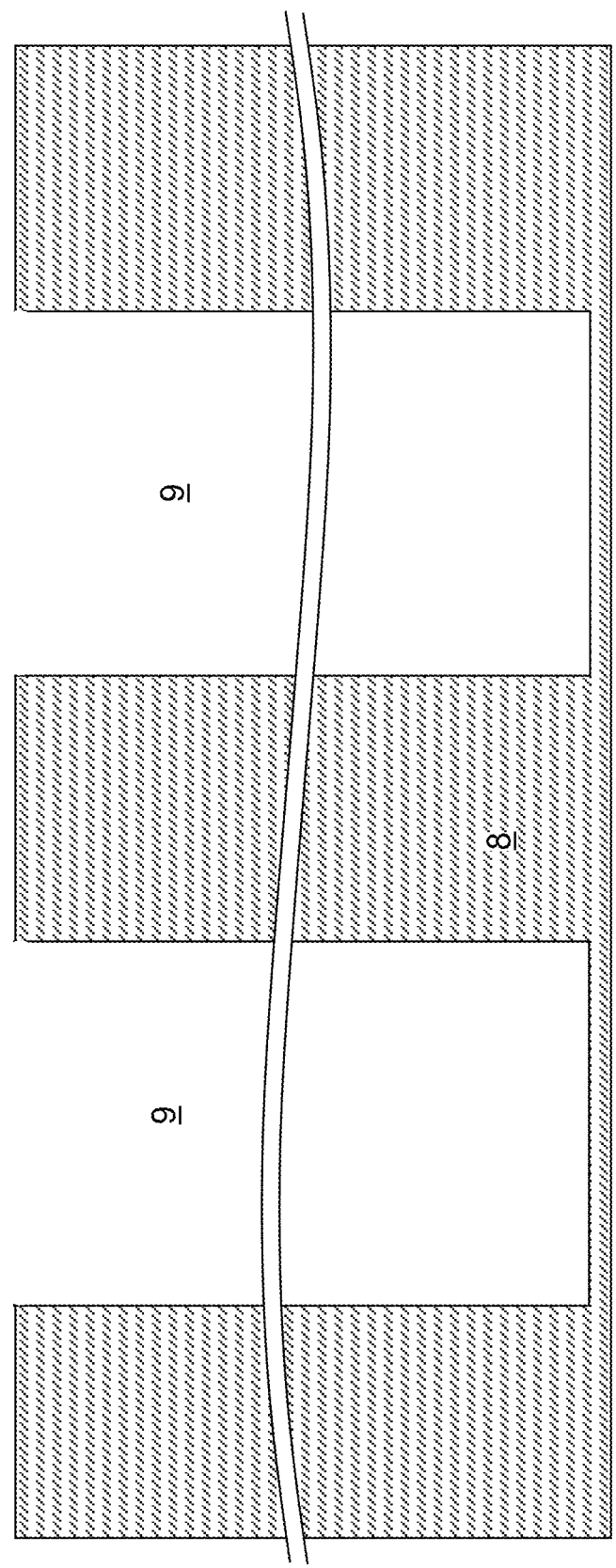
FIG. 1B is a vertical cross-sectional view of a region of the exemplary structure along the vertical plane B-B' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a deep trench capacitor that minimizes the amount of space occupied on the semiconductor die for connections to the deep trench capacitor and methods of forming the same.

Deep trench capacitors may be used as an integrated passive device to provide large capacitance. Such deep trench capacitors may be used to stabilize a power supply and function as a noise filter in handheld devices. Deep trench capacitors may be formed in a first semiconductor die as a component of a power supply circuit. The first semiconductor die may be subsequently bonded to a second semiconductor die which may be a system-on-a-chip (SoC) semiconductor die. Multiple metallic electrode layers may be used to increase the capacitance per unit area for a deep trench capacitor. Stepped surfaces may be formed to pattern horizontally-extending portions of the multiple metallic electrode layers of a deep trench capacitor. The stepped surfaces are typically formed around a periphery of a horizontally-extending portion of the multiple metallic electrode layers located outside the deep trenches. As such, the stepped surfaces may occupy a significant device area without providing significant capacitance to the deep trench capacitor.

According to an aspect of the present disclosure, stepped surfaces may be eliminated from a deep trench capacitor. Contacts to the various metallic electrode layers may be formed within the area between a neighboring pair of deep trenches by using laterally-insulated contact structures that provide electrical isolation from neighboring horizontally-extending portions of the metallic electrode layers. Specifically, contact assemblies are used to provide electrical contact to the metallic electrode layers. Each of the contact assemblies includes a respective tubular insulating spacer and a respective contact via structure that is laterally surrounded by the respective tubular insulating spacer. The contact assemblies have different vertical extents to provide electrical contact to various metallic electrode layers located at different levels. The different vertical extents of the contact assemblies may be provided by selectively vertically extending different subsets of via cavities using multiple lithographic patterning processes. The various aspects of the present disclosure are now described with reference to accompanying drawings.

Referring to FIGS. 1A and 1B, an exemplary structure according to an embodiment of the present disclosure is illustrated, which comprises a substrate 8 having a planar top surface. The substrate 8 may be a semiconductor substrate including a semiconductor material, and may have a thickness of at least 10 microns. In one embodiment, the substrate 8 may include a commercially available semiconductor wafer that may be diced into semiconductor dies after formation of deep trenches. For example, the substrate 8 may include a semiconductor substrate including single crystalline silicon and having a thickness in a range from 500 microns to 1,500 microns, although thicker or thinner thicknesses may be used.

At least one deep trench 9 vertically extending into the substrate 8 may be formed by forming a patterned etch mask layer on the front side surface of the substrate 8. In one embodiment, the at least one deep trench 9 may include a plurality of deep trenches. The pattern in the patterned etch mask layer may be transferred into an upper portion of the substrate 8. An optional pad dielectric layer (not shown) such as a silicon oxide pad layer may be formed on the front side surface, i.e., the top surface, of the substrate 8 prior to formation of the patterned etch mask layer. In an exemplary embodiment, the pad dielectric layer may include a silicon oxide layer having a thickness in a range from 20 nm to 100 nm, although thicker or thinner thicknesses may be used.

The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer, forming a lithographically patterned photoresist layer over the blanket etch mask layer, and by transferring the pattern in the lithographically patterned photoresist layer through the blanket etch mask layer using an anisotropic etch process such as a reactive ion etch process.

An anisotropic etch process may be performed to transfer the pattern in the patterned etch mask layer through an upper portion of the substrate 8 to form the deep trenches 9. For example, a reactive ion etch process using a combination of gases including HBr, $NF_3$, $O_2$, and $SF_6$ may be used to form the deep trenches 9. The depth of the deep trenches 9 may be in a range from 2 micron to 20 microns, such as from 3 microns to 10 microns, although deeper or shallower trenches may be formed. The horizontal cross-sectional shape of each deep trench 9 may have a shape of a circle, an ellipse, a rectangle, a rounded rectangle, an annulus having an inner periphery and an outer periphery of various shapes, or of any two-dimensional shape that defines an enclosed volume. Generally, at least one deep trench 9 extending downward from a top surface of the substrate may be formed in the substrate 8. The at least one deep trench 9 may comprise a plurality of deep trenches 9 having a depth that is greater than 2 microns.

In one embodiment, each of the deep trenches 9 may be laterally elongated with a uniform width. A predominant portion (such as more than 50% of the entire area) of each deep trench 9 may have a width that is sufficient to accommodate vertically-extending portions of all metallic electrode layers and at least two node dielectric layers to be subsequently formed. For example, a predominant portion of each deep trench 9 may have a width that is sufficient to accommodate vertically-extending portions of at least three metallic electrode layers and at least two node dielectric layers. In an illustrative example, a predominant portion of each deep trench 9 may have a width that is in a range from 50 nm to 1,000 nm, although lesser and greater widths may also be used.

In one embodiment, first-type deep trenches 9A and second-type deep trenches 9B may be formed into an upper portion of the substrate 8. The first-type deep trenches 9A may have first lengthwise sidewalls 91 that laterally extend along a first horizontal direction hd1 and the second-type deep trenches 9B may have second lengthwise sidewalls 92 that laterally extend along a second horizontal direction hd2 that is different from the first horizontal direction hd1. In one embodiment, the second horizontal direction hd2 may be perpendicular to the first horizontal direction hd1.

In one embodiment, clusters of subsets of the first-type deep trenches 9A and clusters of subsets of the second-type deep trenches 9B laterally alternate along at least one direction that is selected from the first horizontal direction hd1 and the second horizontal direction hd2. The second horizontal direction hd2 may be perpendicular to the first horizontal direction hd1. In one embodiment, the clusters of subsets of the first-type deep trenches 9A and clusters of subsets of the second-type deep trenches 9B laterally alternate along the first horizontal direction hd1 and the second horizontal direction hd2.

The photoresist layer may be removed prior to the anisotropic etch process that forms the deep trenches 9, or may be consumed during the anisotropic etch process that forms the deep trenches 9. The patterned etch mask layer and the optional dielectric pad layer may be subsequently removed, for example, by a respective isotropic etch process such as a wet etch process. FIG. 1A is a top-down view of an exemplary structure after formation of deep trenches 9 into a substrate 8 according to an embodiment of the present disclosure. An inset illustrates a magnified view of a portion of the exemplary structure.

Figure 2:
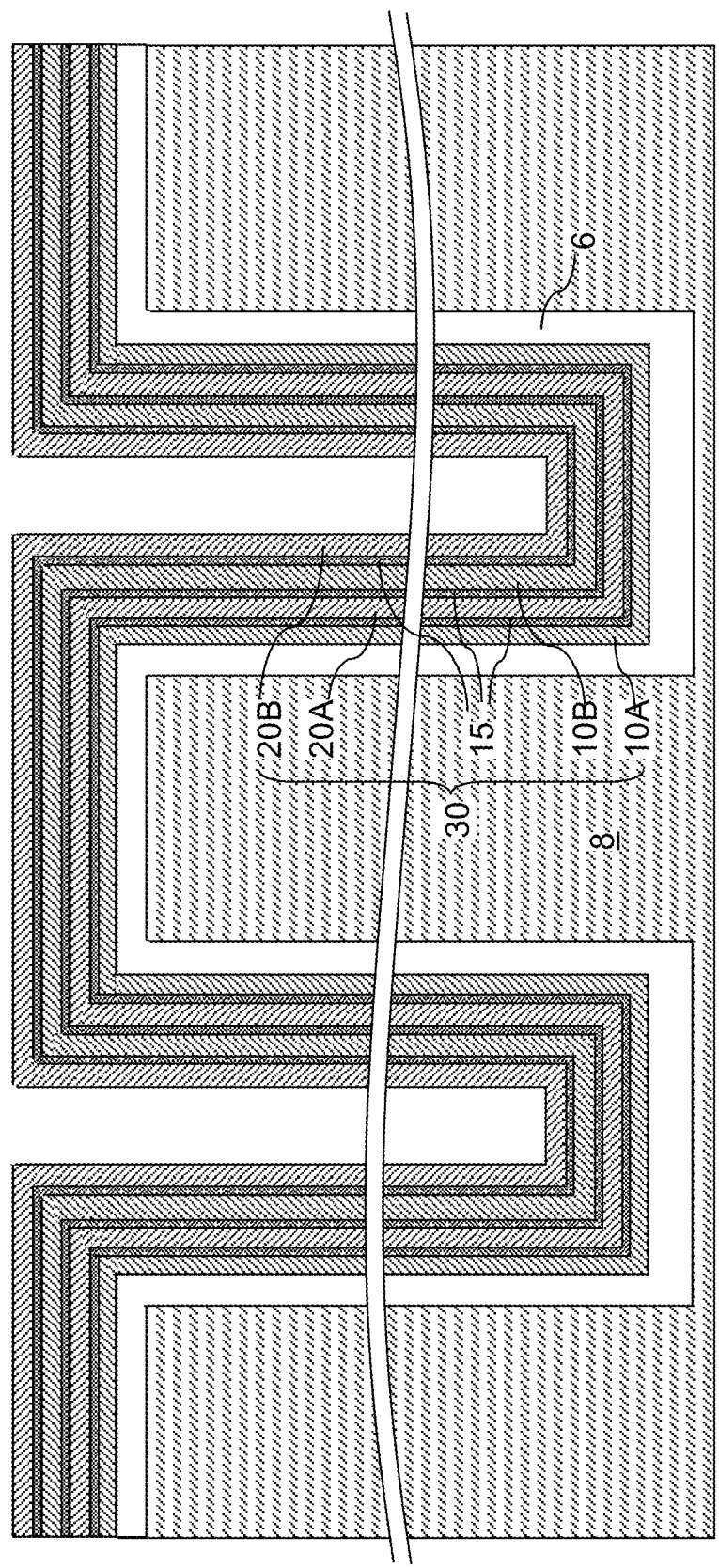
FIG. 2 is a vertical cross-sectional view of a region of the exemplary structure after formation of a layer stack including at least three metallic electrode layers interlaced with at least two node dielectric layers according to an embodiment of the present disclosure.

Referring to FIG. 2, a dielectric liner 6 may be formed on the exposed surface of the semiconductor substrate 8 including the top surface of the semiconductor substrate 8 and sidewalls of the deep trenches 9. The dielectric liner 6 may include a dielectric material that provides electrical isolation between the deep trench capacitors to be subsequently formed and the substrate 8. For example, the dielectric liner 6 may include silicon oxide, silicon nitride, silicon oxynitride, and/or a dielectric metal oxide. Other suitable dielectric liner materials within the contemplated scope of disclosure may also be used. In an illustrative example, the dielectric liner 6 may include a silicon oxide layer formed by thermal oxidation of surface portions of the substrate 8 that includes silicon. The thickness of the dielectric liner 6 may be in a range from 4 nm to 100 nm, although lesser and greater thicknesses may also be used.

A layer stack 30 of metallic electrode layers (10A, 20A, 10B, 20B) and node dielectric layers 15 may be formed by a respective conformal deposition process. The layer stack 30 includes at least three metallic electrode layers (10A, 20A, 10B, 20B) interlaced with at least two node dielectric layers 15, and continuously extending over the top surface of the semiconductor substrate 8 and into each of the at least one deep trench 9. The layer stack 30 continuously extends into each deep trench 9, and a cavity is present in an unfilled volume each the deep trench 9. Generally, the at least three metallic electrode layers (10A, 20A, 10B, 20B) and the at least two node dielectric layers 15 are deposited by a respective conformal deposition process. Generally, at least two node dielectric layers 15, which may include at least three node dielectric layers 15, may be formed. The at least two node dielectric layers 15 may comprise a first node dielectric layer, a second node dielectric layer, and an optional third node dielectric layer, and so on in the order of proximity from the substrate 8.

Each of the metallic electrode layers (10A, 20A, 10B, 20B) may include a metallic material, which may comprise, and/or consist essentially of, a conductive metallic nitride, an elemental metal, or an intermetallic alloy. In one embodiment, each metallic electrode layer (10A, 20A, 10B, 20B) comprises, and/or consists essentially of, a conductive metallic nitride material, which may be a metallic diffusion barrier material. For example, each metallic electrode layer (10A, 20A, 10B, 20B) may include, and/or may consist essentially of, a conductive metallic nitride material such as TiN, TaN, or WN. Other suitable materials within the contemplated scope of disclosure may also be used.

Use of a metallic diffusion barrier material for the metallic electrode layers (10A, 20A, 10B, 20B) may be advantageous because diffusion of metallic elements through the node dielectric layers 15 and/or through the dielectric liner 6 may cause deleterious effects for deep trench capacitors. Each metallic electrode layer (10A, 20A, 10B, 20B) may be formed by a conformal deposition process such as chemical vapor deposition (CVD) or atomic layer deposition (ALD). The thickness of each metallic electrode layer (10A, 20A, 10B, 20B) may be in a range from 5 nm to 50 nm, such as from 10 nm to 30 nm, although lesser and greater thicknesses may also be used. In one embodiment, each metallic electrode layer (10A, 20A, 10B, 20B) may have the same material composition and the same thickness. In another embodiment, each metallic electrode layer (10A, 20A, 10B, 20B) may have the same material composition but have varying thicknesses. In yet another embodiment, each metallic electrode layer (10A, 20A, 10B, 20B) may have different material composition and the same thickness. In yet another embodiment, each metallic electrode layer (10A, 20A, 10B, 20B) may have different material composition and different thicknesses.

Each of node dielectric layers 15 may include a node dielectric material, which may be a dielectric metal oxide material having a dielectric constant greater than 7.9 (which is the dielectric constant of silicon nitride), i.e., a "high-k" dielectric metal oxide material, or may include silicon nitride. For example, the node dielectric layer 15 may include a dielectric metal oxide material such as aluminum oxide, hafnium oxide, zirconium oxide, tantalum oxide, lanthanum oxide, an alloy or a silicate thereof, and/or a layer stack thereof. In one embodiment, the node dielectric layer 15 may include amorphous aluminum oxide layer that may be subsequently annealed into polycrystalline aluminum oxide material after formation of contact via structures. Other suitable materials within the contemplated scope of disclosure may also be used.

Each node dielectric layer 15 may be formed by a conformal deposition process such as chemical vapor deposition (CVD) or atomic layer deposition (ALD). The thickness of each node dielectric layer 15 may be in a range from 1 nm to 20 nm, such as from 3 nm to 12 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses. For example, in an embodiment, a first node dielectric layer 15 may be thinner than a second node dielectric layer 15.

The total number of the metallic electrode layers (10A, 20A, 10B, 20B) may be in a range from 3 to 16, such as from 4 to 8. The total number of the node dielectric layers 15 may be one less than the total number of the metallic electrode layers (10A, 20A, 10B, 20B).

While the present disclosure is described using an embodiment in which the layer stack 30 of the metallic electrode layers (10A, 20A, 10B, 20B) and the node dielectric layers 15 include four metallic electrode layers (10A, 20A, 10B, 20B) and three node dielectric layers 15, embodiments are expressly contemplated herein in which different numbers of metallic electrode layers (10A, 20A, 10B, 20B) and different numbers of node dielectric layers 15 may be used within the layer stack 30. Generally, a layer stack 30 may include at least three metallic electrode layers (10A, 20A, 10B, 20B) interlaced with at least two node dielectric layers 15 that may be formed in, and over, at least one deep trench 9 formed in a substrate 8.

The metallic electrode layers (10A, 20A, 10B, 20B) may be sequentially numbered in the order of deposition. For example, the metallic electrode layers (10A, 20A, 10B, 20B) may include a first metallic electrode layer 10A, a second metallic electrode layer 20A, a third metallic electrode layer 10B, a fourth metallic electrode layer 20B, etc. in an order of proximity from the substrate 8. Patterned portions of each odd-numbered metallic electrode layer (10A, 10B) may be subsequently used to form a primary electrode assembly that functions as a primary node, i.e., a first node, of a deep trench capacitor, and patterned portions of each even-numbered metallic electrode layer (20A, 20B) may be subsequently used to form a complementary electrode assembly that functions as a complementary node, i.e., a second node, of the deep trench capacitor. The total number of the metallic electrode layers (10A, 20A, 10B, 20B), the thicknesses of the metallic electrode layers (10A, 20A, 10B, 20B), and the width of the deep trenches 9 may be selected such that a predominant portion (i.e., more than 50%) of the entire volume of each deep trench 9 may be filled with the layer stack 30 without completely filling the deep trench 9.

Generally, a layer stack 30 including at least three metallic electrode layers (10A, 20A, 10B, 20B) interlaced with at least two node dielectric layers 15 may be formed over the substrate 8. The layer stack 30 continuously extends over the top surface of the substrate 8 and into each of the at least one deep trench 9 (such as the plurality of deep trenches 9), a cavity is present in an unfilled volume of each deep trench 9.

Figure 3:
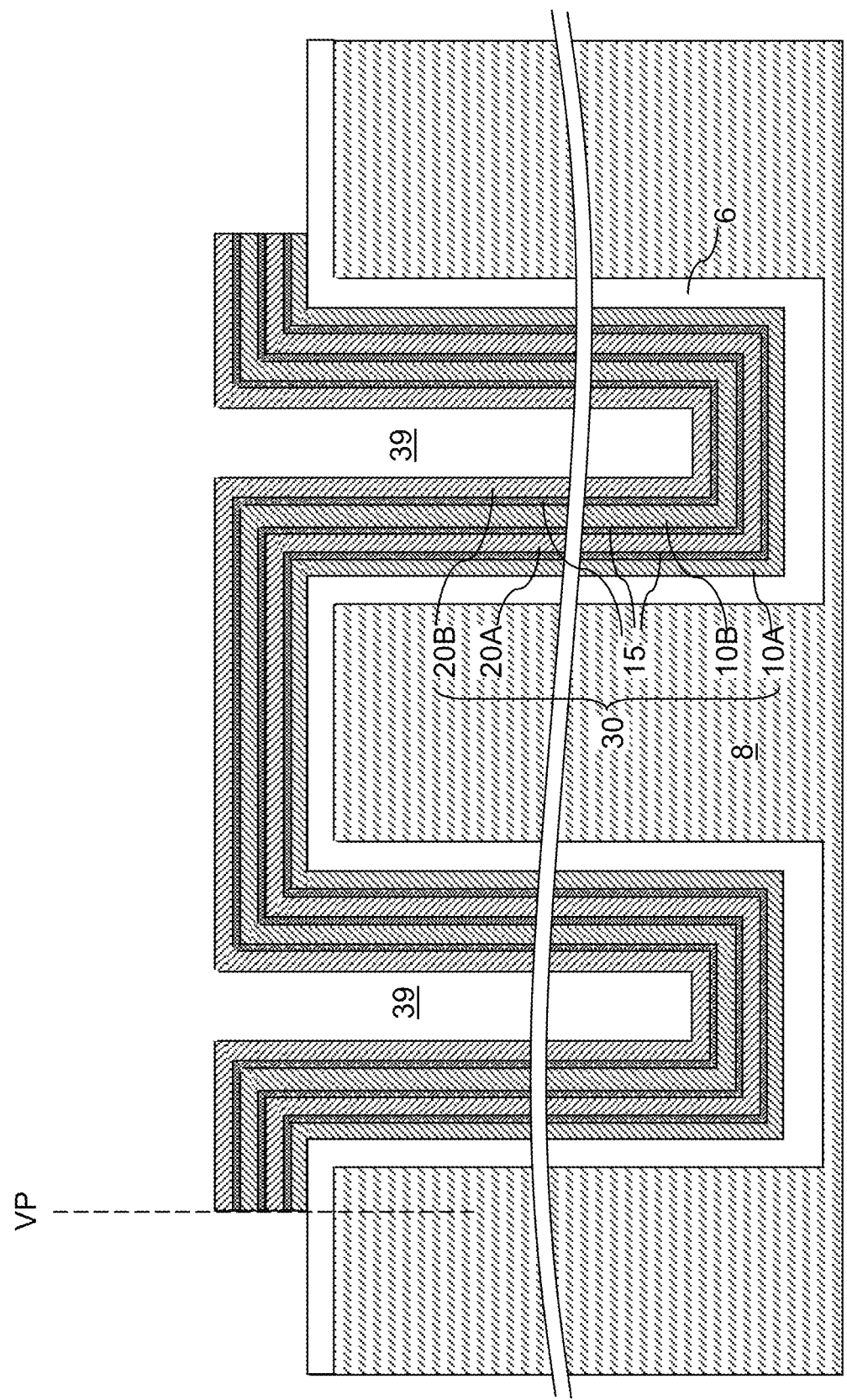
FIG. 3 is a vertical cross-sectional view of a region of the exemplary structure after patterning the layer stack according to an embodiment of the present disclosure.

Referring to FIG. 3, a photoresist layer (not shown) may be applied over the exemplary structure, and may be lithographically patterned to cover each area of a deep trench capacitor. In one embodiment, the area of a deep trench capacitor may continuously extend over an entire area of a semiconductor die. In another embodiment, a semiconductor die may include a plurality of deep trench capacitors, and the area of a deep trench capacitor may be a fraction of the entire area of a semiconductor die. A periphery of a patterned portion of the photoresist layer may continuously extend over a horizontal surface of the substrate 8.

An anisotropic etch process may be performed to etch unmasked portions of the layer stack 30. The layer stack 30 is patterned such that vertical surfaces of the patterned layer stack 30 overlie the horizontal top surface of the substrate 8. In one embodiment, physically exposed sidewalls of each layer within the layer stack 30 may be vertically coincident, i.e., located within a same vertical plane VP. In one embodiment, sidewalls of all layers within each horizontally-extending portion of the layer stack 30 that overlie the substrate 8 may be vertically coincident with one another. A cavity 39 is present within each unfilled volume of the deep trenches 9.

Figure 4:
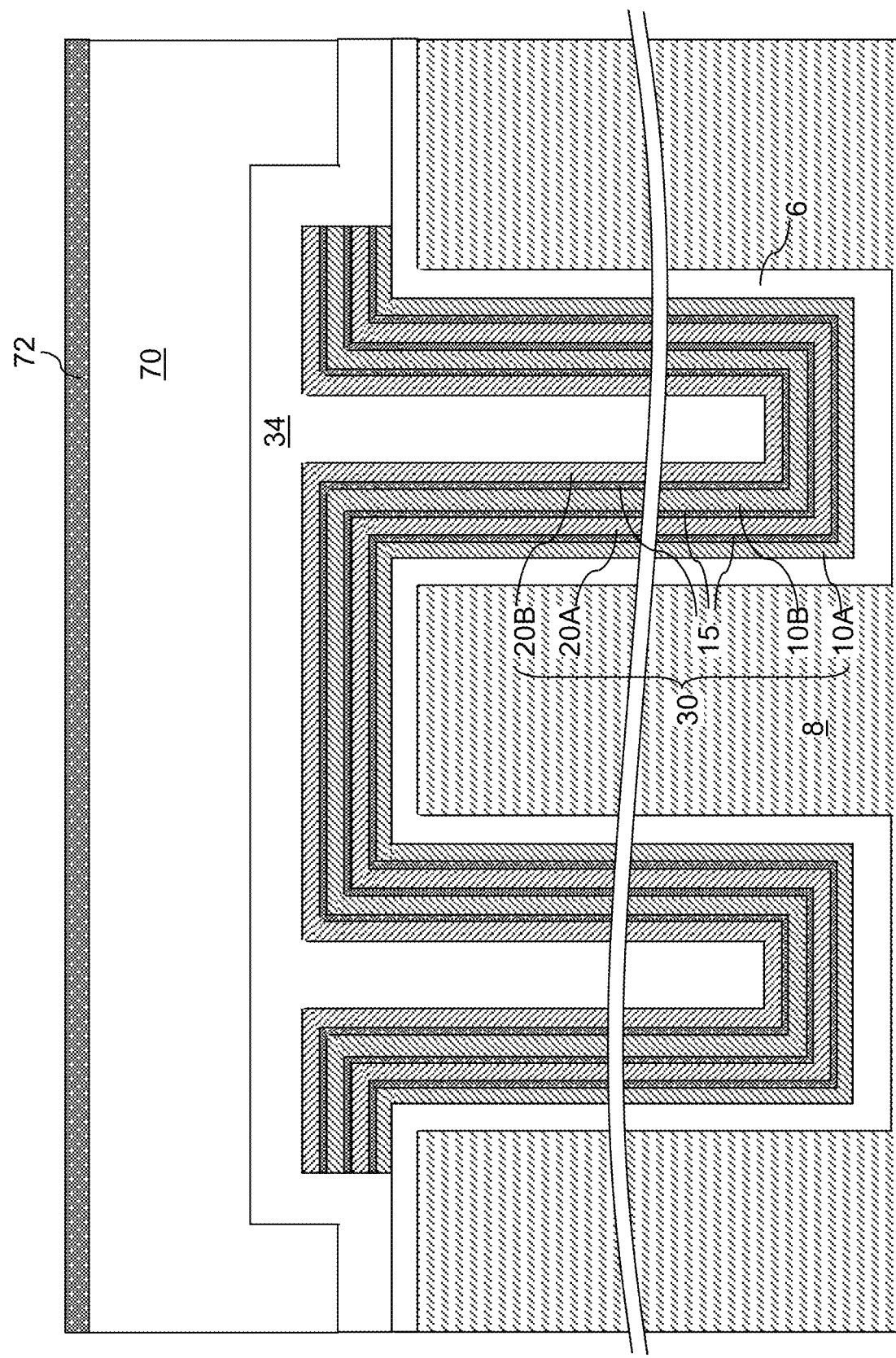
FIG. 4 is a vertical cross-sectional view of a region of the exemplary structure after formation of a dielectric fill material layer, a contact-level dielectric layer, and a dielectric hard mask layer according to an embodiment of the present disclosure.

Referring to FIG. 4, a dielectric fill material layer 34 may be deposited over the semiconductor substrate 8 and within each of the cavities 39. The dielectric fill material layer 34 includes a dielectric fill material such as undoped silicate glass, a doped silicate glass, silicon oxynitride, a silicon oxide carbide, or organosilicate glass. Other suitable dielectric fill material is within the contemplated scope of disclosure. In one embodiment, the dielectric fill material layer 34 may be deposited by a conformal deposition process such as a chemical vapor deposition (CVD) process.

The dielectric fill material layer 34 includes a horizontally-extending portion that overlies a topmost surface of the layer stack 30 and at least one vertically-extending portion (which may be a plurality of vertically-extending portions) that extends downward from the horizontally-extending portion into a center region of a respective one of the at least one deep trench 9 (which may be a plurality of deep trenches 9). Generally, the dielectric fill material layer 34 includes at least one vertically-extending portion that extends into the at least one deep trench 9 and a horizontally-extending portion that overlies a horizontally-extending portion of the layer stack 30. In one embodiment, vertical sidewalls of the dielectric fill material layer 34 may contact a respective one of the sidewalls of the layers within the horizontally-extending portion of the layer stack 30.

In one embodiment, each of the at least one vertically-extending portion of the dielectric fill material layer 34 may be laterally surrounded by vertically-extending portions of the at least three metallic electrode layers (10A, 20A, 10B, 20B) and the at least two node dielectric layers 15. The thickness of a horizontal portion of the dielectric fill material layer 34 overlying the top surface of the semiconductor substrate 8 may have a thickness in a range from 50 nm to 300 nm, although lesser and greater thicknesses may also be used.

A contact-level dielectric layer 70 may be deposited over the dielectric fill material layer 34. The contact-level dielectric layer 70 includes an interconnect-level dielectric material such as undoped silicate glass, a doped silicate glass, or organosilicate glass. The material of the contact-level dielectric layer 70 may be the same as, or may be different from, the material of the dielectric fill material layer 34. In one embodiment, the top surface of the contact-level dielectric layer 70 may be optionally planarized to provide a horizontal top surface. The thickness of the contact-level dielectric layer, as measured outside the area(s) of the layer stack 30, may be in a range from 100 nm to 1,000 nm, although lesser and greater thicknesses may also be used.

A dielectric hard mask layer 72 may be deposited over the contact-level dielectric layer 70. The dielectric hard mask layer 72 includes a dielectric material that may be used as an hard mask during subsequent etching of the layers within the layer stack 30. For example, the dielectric hard mask layer 72 may include silicon nitride or a dielectric metal oxide (such as aluminum oxide). Other suitable dielectric hard mask materials are within the contemplated scope of disclosure. In one embodiment, the dielectric hard mask layer 72 may have a thickness in a range from 30 nm to 300 nm, although lesser and greater thicknesses may also be used.

Figure 5:
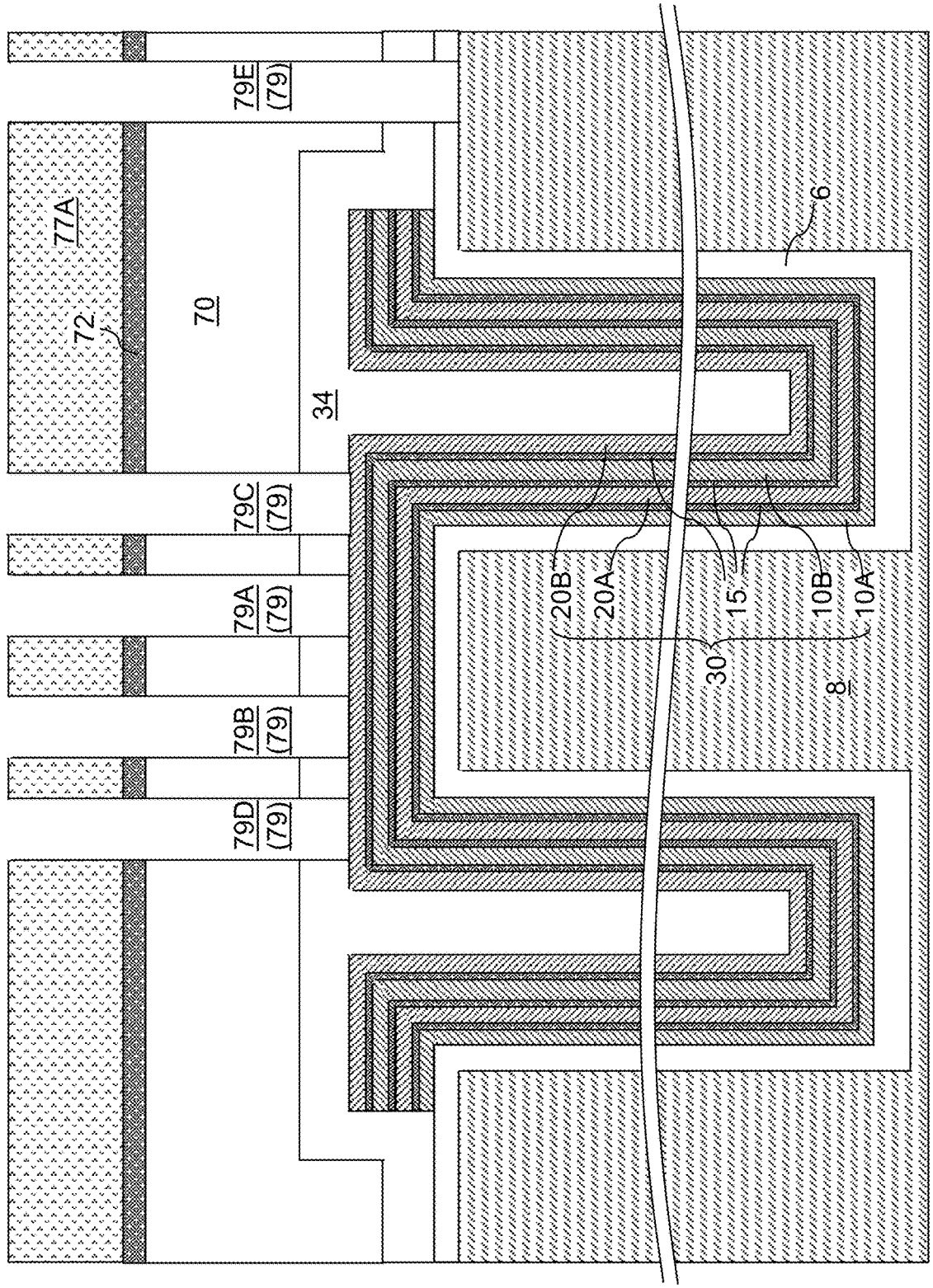
FIG. 5 is a vertical cross-sectional view of the region of the exemplary structure after formation of contact via cavities according to an embodiment of the present disclosure.

Referring to FIG. 5, a first photoresist layer 77A may be formed over the dielectric hard mask layer 72, and may be lithographically patterned to form openings in an area including a horizontally-extending portion of the layer stack 30. The number of openings in the first photoresist layer 77A over the horizontally-extending portion of the layer stack 30 may be the same as, or may be greater than, the total number of metallic electrode layers (10A, 20A, 10B, 20B) in the layer stack 30. Further, at least one additional opening (i.e., 79E) may be formed in the first photoresist layer 77A outside the area of the layer stack 30.

An anisotropic etch process may be performed to transfer the pattern of the openings in the first photoresist layer 77A through the dielectric hard mask layer 72, the contact-level dielectric layer 70, the dielectric fill material layer 34, and the dielectric liner 6. In one embodiment, the chemistry of the anisotropic etch process may be selective to the metallic material of the topmost metallic electrode layer such as the fourth metallic electrode layer 20B. Optionally, the chemistry of the anisotropic etch process may be selective to the semiconductor material of the substrate 8. Via cavities 79 may be formed through the dielectric hard mask layer 72 and the contact-level dielectric layer 70. The via cavities 79 may include a set of via cavities that vertically extend to a top surface of the topmost metallic electrode layer such as a first via cavity 79A, a second via cavity 79B, a third via cavity 79C, and a fourth via cavity 79D. Further, the via cavities 79 may include a fifth via cavity 79E that vertically extends to a top surface of the substrate 8. In one embodiment, each of the via cavities 79 have a respective straight sidewall that vertically extends from a top surface of the dielectric hard mask layer 72 to a top surface of the topmost metallic electrode layer or to a top surface of the substrate 8. The sidewalls of the via cavities 79 may be vertical, or may be tapered. The first photoresist layer 77A may be subsequently removed, for example, by ashing.

Some of the via cavities 79 formed at this processing step are in-process via cavities, i.e., via cavities that are subsequently modified. For example, the first via cavity 79A, the second via cavity 79B, and the third via cavity 79C may be subsequently vertically extended. In one embodiment, the first via cavity 79A, the second via cavity 79B, the third via cavity 79C, and the fourth via cavity 79D may have the same depth.

According to an aspect of the present disclosure, the via cavities (79A, 79B, 79C, 79D) as formed at this processing step may be subsequently selectively vertically extended by different vertical extension distances to form contact via cavities having different depths.

Figure 6:
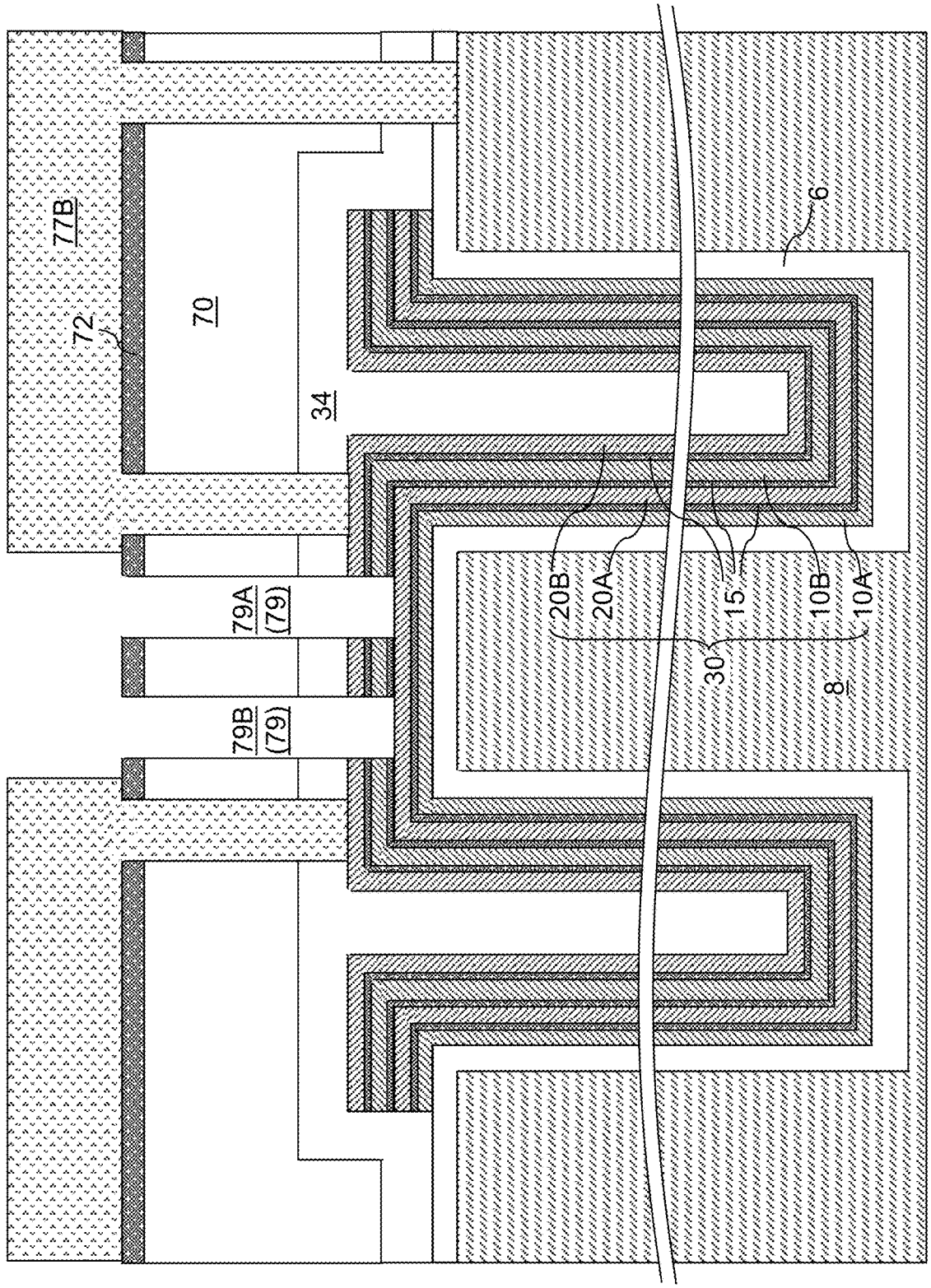
FIG. 6 is a vertical cross-sectional view of the region of the exemplary structure after vertically extending a subset of the contact via cavities according to an embodiment of the present disclosure.

Referring to FIG. 6, a second photoresist layer 77B may be applied over the dielectric hard mask layer 72, and may be lithographically patterned such that the second photoresist layer 77B does not cover a first subset of the via cavities 79, and covers a second subset of the via cavities 79. For example, the second photoresist layer 77B may be patterned such that the second photoresist layer 77B does not cover the first via cavity 79A and the second via cavity 79B, and covers the third via cavity 79C, the fourth via cavity 79D, and the fifth via cavity 79E.

An anisotropic etch process may be performed to sequentially etch the materials of the fourth metallic electrode layer 20B, the third node dielectric layer 15, the third metallic electrode layer 10B, and the second node dielectric layer 15. In one embodiment, the chemistry of the anisotropic etch process may be selective to the material of the dielectric hard mask layer 72. In this embodiment, the metallic material of two underlying metallic electrode layers (10B, 20B) may be removed selective to the dielectric material of the dielectric hard mask layer 72. The first subset of the via cavities 79 (such as the first via cavity 79A and the second via cavity 79B) may be vertically extended through two metallic electrode layers (such as the fourth metallic electrode layer 20B and the third metallic electrode layer 10B) selected from the at least three metallic electrode layers (10A, 20A, 10B, 20B) and through two node dielectric layers (such as the third node dielectric layer 15 and the second node dielectric layer 15) selected from the at least two node dielectric layers 15. The second photoresist layer 77B may be subsequently removed, for example, by ashing.

Figure 7:
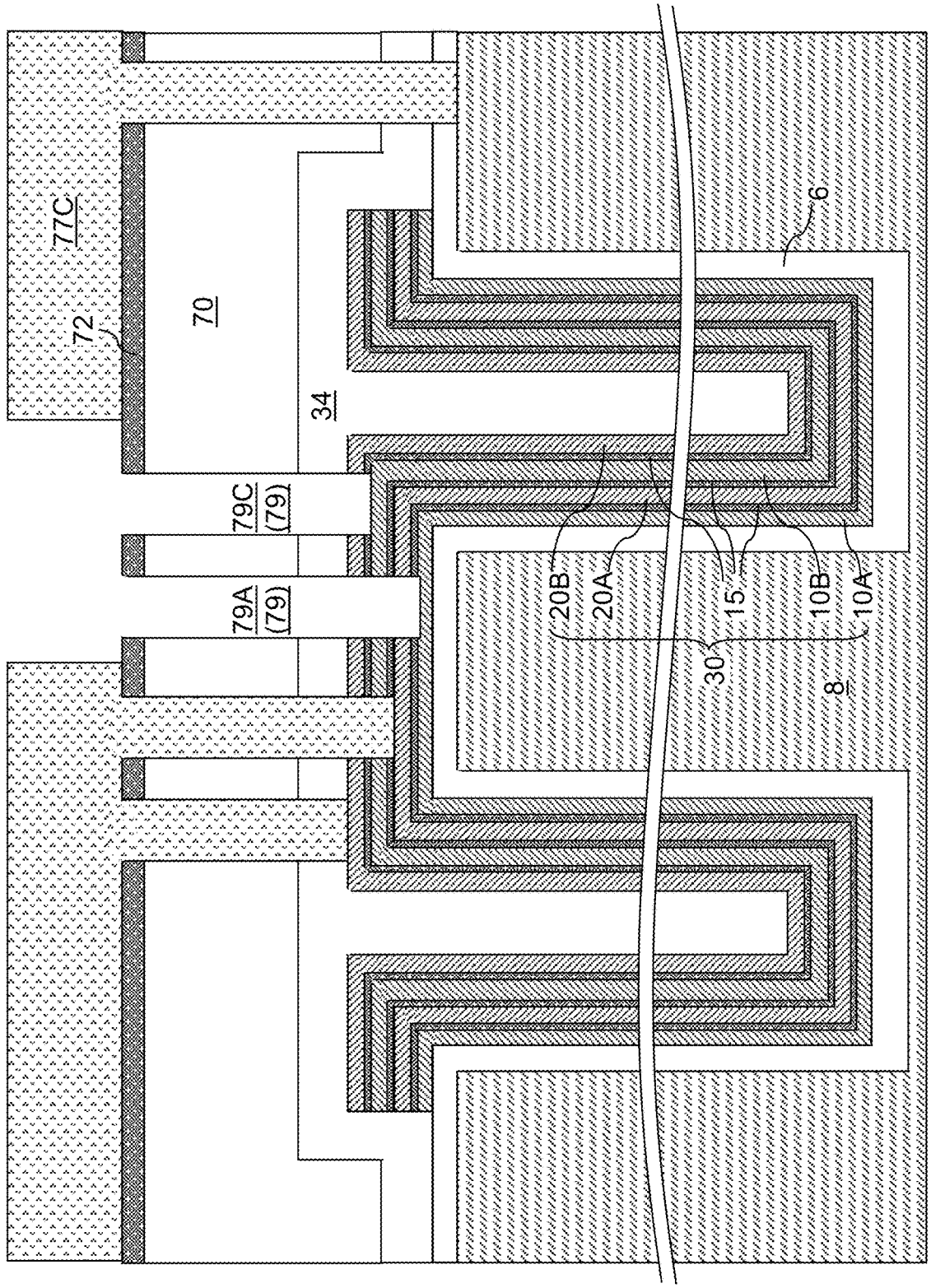
FIG. 7 is a vertical cross-sectional view of the region of the exemplary structure after vertically extending another subset of the contact via cavities according to an embodiment of the present disclosure.

Referring to FIG. 7, a third photoresist layer 77C may be applied over the dielectric hard mask layer 72, and may be lithographically patterned such that the third photoresist layer 77C does not cover the first via cavity 79A selected from the first subset (79A, 79B) of the via cavities 79 and covers the second via cavity 79B selected from the first subset (79A, 79B) of the via cavities 79. In one embodiment, the third photoresist layer 77C may be patterned such that the third photoresist layer 77C does not cover the third via cavity 79C selected from the second subset (79C, 79D, 79E) of the via cavities 79 and covers the fourth via cavity 79D and the fifth via cavity 79E selected from the second subset (79C, 79D, 79E) of the via cavities 79.

An anisotropic etch process may be performed to sequentially etch the materials of an underlying metallic electrode layer (20A or 20B) and an underlying node dielectric layer 15 underneath each of the first via cavity 79A and the third via cavity 79C. Specifically, the second metallic electrode layer 20A and the first node dielectric layer 15 may be etched underneath the first via cavity 79A, and the fourth metallic electrode layer 20B and the third node dielectric layer 15 may be etched underneath the third via cavity 79C. In one embodiment, the chemistry of the anisotropic etch process may be selective to the material of the dielectric hard mask layer 72. In this embodiment, the metallic materials of the metallic electrode layers (20A, 20B) may be removed selective to the dielectric material of the dielectric hard mask layer 72. The first via cavity 79A may be vertically extended through the second metallic electrode layer 20A and the first node dielectric layer 15 down to a top surface of the first metallic electrode layer 10A. The third via cavity 79C may be vertically extended through the fourth metallic electrode layer 20B and the third node dielectric layer 15 down to a top surface of the third metallic electrode layer 10B.

Figure 8:
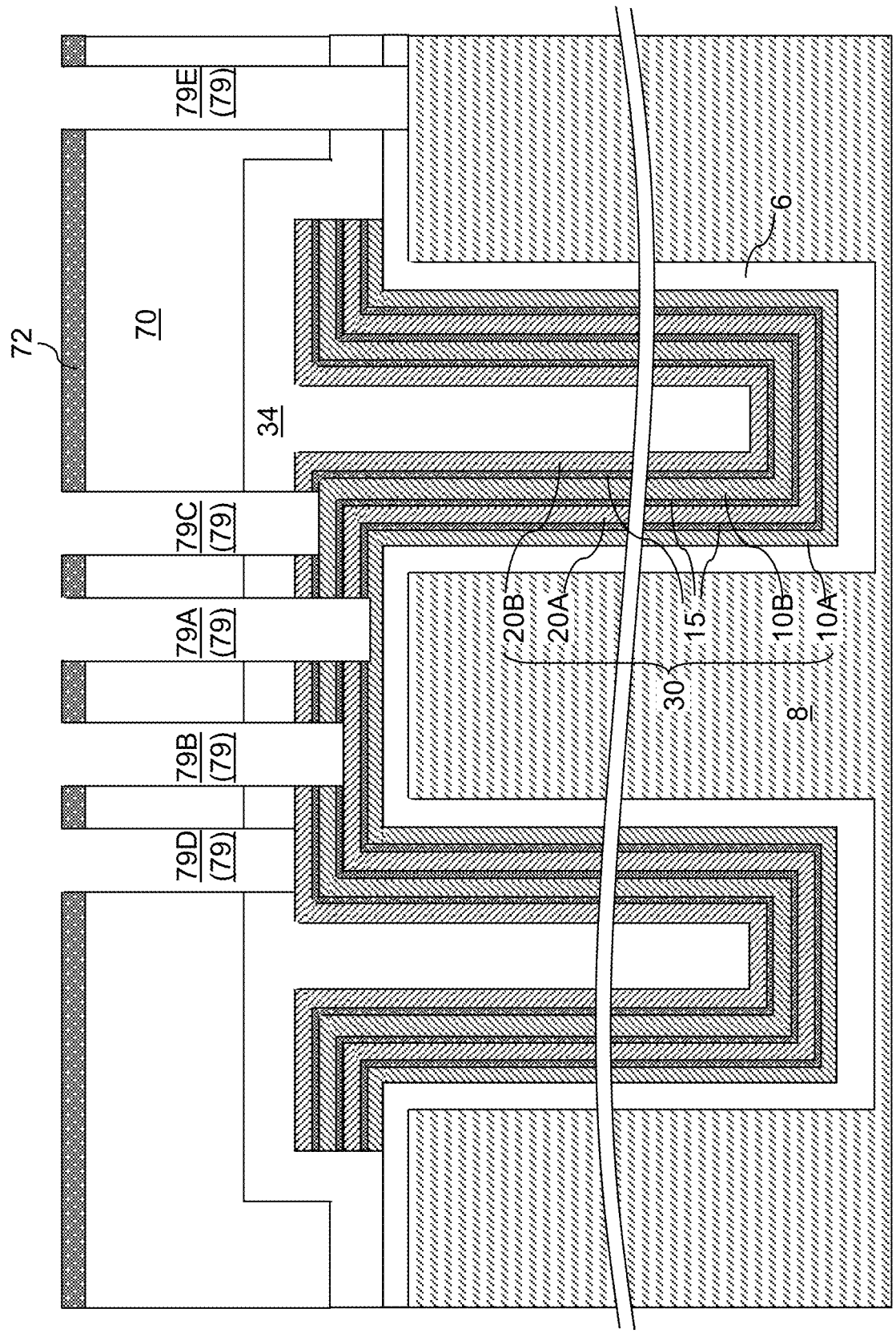
FIG. 8 is a vertical cross-sectional view of the region of the exemplary structure after removal of a third photoresist layer according to an embodiment of the present disclosure.

Referring to FIG. 8, the third photoresist layer 77C may be subsequently removed, for example, by ashing. Contact via cavities 79 vertically extending through the dielectric hard mask layer 72 and the contact-level dielectric layer 70 may be formed. Generally, each of the metallic electrode layers (10A, 20A, 10B, 20B) may have a surface that is physically exposed to a respective one of the contact via cavities 79. In embodiments in which more than four metallic electrode layers (10A, 20A, 10B, 20B) are used, additional lithographic patterning steps and additional anisotropic etch processes may be used to provide a set of contact via cavities 79 that vertically extend to each of the metallic electrode layers (10A, 20A, 10B, 20B). In embodiments in which the layer stack includes three metallic electrode layers (10A, 10B, 20A), the depth of the anisotropic etch processes and/or the pattern of the openings in the photoresist layers may be modified such that a top surface of each metallic electrode layer (10A, 10B, 20A) is physically exposed at the bottom of a respective one of the contact via cavities 79.

Figure 9:
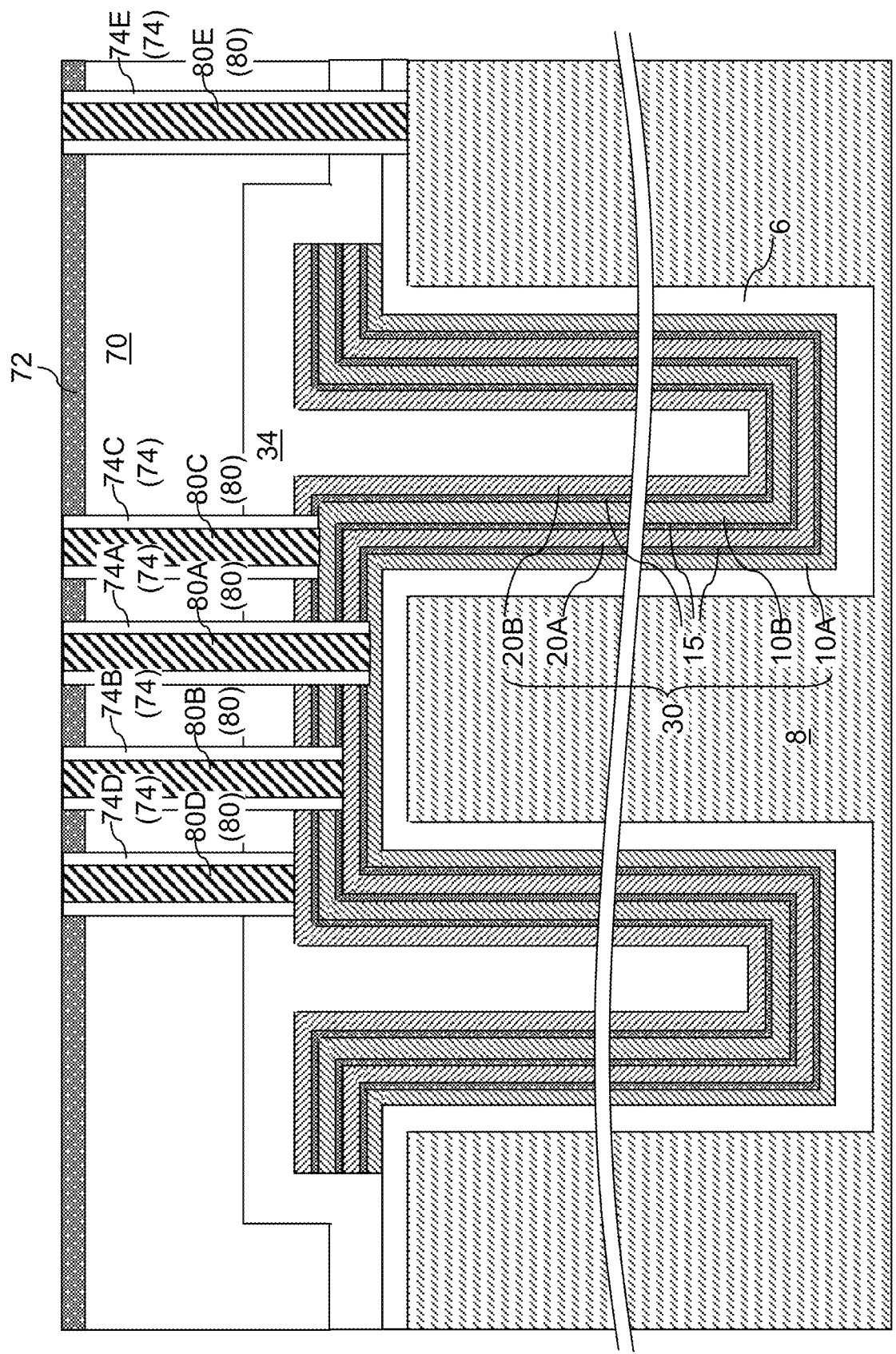
FIG. 9 is a vertical cross-sectional view of the region of the exemplary structure after formation of contact assemblies according to an embodiment of the present disclosure.

Referring to FIG. 9, an insulating material layer such as a silicon oxide layer may be conformally deposited in the contact via cavities 79 and over the dielectric hard mask layer 72. The thickness of the insulating material layer may be less than one half of the width of each contact via cavity 79. Thus, a void that is not filled with the insulating material layer is present within each contact via cavity 79.

An anisotropic etch process may be performed to remove horizontal portions of the insulating material layer from above the top surface of the dielectric hard mask layer 72 and from the bottom portion of each of the contact via cavities 79. Each remaining tubular portion of the insulating material layer located at a periphery of a respective one of the contact via cavities 79 constitutes a tubular insulating spacer 74. In one embodiment, the thickness (i.e., the lateral distance between an inner sidewall and an outer sidewall) of each tubular insulating spacer 74 may be in a range from 1% to 30% of a lateral dimension (such as a diameter and/or a width) of a respective contact via cavity 79. For example, the thickness of each tubular insulating spacer 74 may be in a range from 20 nm to 200 nm, although lesser and greater thicknesses may also be used.

At least one conductive material may be deposited in the voids that are present within the contact via cavities 79 after formation of the tubular insulating spacers 74. The at least one conductive material may include a heavily doped semiconductor material and/or at least one metallic material. For example, a combination of a metallic nitride liner including a metallic nitride (such as TiN, TaN, and/or WN) and a metallic fill material (such as Cu, Co, Ru, Mo, and/or W) may be deposited in the voids laterally surrounded by the tubular insulating spacers 74. Other suitable metallic nitride liner materials and metallic fill materials are within the contemplated scope of disclosure. Excess portions of the at least one conductive material located above the horizontal plane including the top surface of the dielectric hard mask layer 72 may be removed by a planarization process such as a chemical mechanical polishing (CMP) process and/or a recess etch process. Each remaining portion of the at least one conductive material located within a respective one of the contact via cavities 79 constitutes a contact via structure 80. Each contiguous combination of a contact via structure 80 and a tubular insulating spacer 74 constitutes a contact assembly (74, 80).

Each of the contact assemblies (74, 80) comprises a respective tubular insulating spacer 74 and a respective contact via structure 80 that is laterally surrounded by the respective tubular insulating spacer 74. In an illustrative example, a first contact assembly (74A, 80A) selected from the contact assemblies (74, 80) may comprise a first tubular insulating spacer 74A that is formed directly on a top surface of the first metallic electrode layer 10A, directly on a first cylindrical sidewall of the first node dielectric layer 15, directly on a first cylindrical sidewall of the second metallic electrode layer 20A, directly on a first cylindrical sidewall of the second node dielectric layer 15, directly on a first cylindrical sidewall of the third metallic electrode layer 10B, directly on a first cylindrical sidewall of the third node dielectric layer 15, and directly on a first cylindrical sidewall of the fourth metallic electrode layer 20B. The first sidewalls of the various layers that the first tubular insulating spacer 74A contacts may be vertically coincident with one another. The first contact via structure 80A may contact a horizontal surface of the first metallic electrode layer 10A, and may be laterally spaced from each of the second metallic electrode layer 20A, the third metallic electrode layer 10B, and the fourth metallic electrode layer 20B by the first tubular insulating spacer 74A.

A second contact assembly (74B, 80B) selected from the contact assemblies (74, 80) may comprise a second tubular insulating spacer 74B that is formed directly on a top surface of the second metallic electrode layer 20A, directly on a second cylindrical sidewall of the second node dielectric layer 15, directly on a second cylindrical sidewall of the third metallic electrode layer 10B, directly on a second cylindrical sidewall of the third node dielectric layer 15, and directly on a second cylindrical sidewall of the fourth metallic electrode layer 20B. The second sidewalls of the various layers that the second tubular insulating spacer 74B contacts may be vertically coincident with one another. The second contact via structure 80B may contact a horizontal surface of the second metallic electrode layer 20A, and may be laterally spaced from each of the third metallic electrode layer 10B and the fourth metallic electrode layer 20B by the second tubular insulating spacer 74B.

A third contact assembly (74C, 80C) selected from the contact assemblies (74, 80) may comprise a third tubular insulating spacer 74C that is formed directly on a top surface of the third metallic electrode layer 10B, directly on a third cylindrical sidewall of the third node dielectric layer 15, and directly on a third cylindrical sidewall of the fourth metallic electrode layer 20B. The third sidewalls of the various layers that the third tubular insulating spacer 74C contacts may be vertically coincident with one another. The third contact via structure 80C may contact a horizontal surface of the third metallic electrode layer 10B, and may be laterally spaced from the fourth metallic electrode layer 20B by the third tubular insulating spacer 74C.

A fourth contact assembly (74D, 80D) selected from the contact assemblies (74, 80) may comprise a fourth tubular insulating spacer 74D that is formed directly on a top surface of the fourth metallic electrode layer 20B. The fourth contact via structure 80D may contact a horizontal surface of the fourth metallic electrode layer 20B, and may be laterally spaced from the contact-level dielectric layer 70 by the fourth tubular insulating spacer 74D.

A fifth contact assembly (74E, 80E) selected from the contact assemblies (74, 80) may comprise a fifth tubular insulating spacer 74E that is formed directly on a top surface of the substrate 8. The fifth contact via structure 80E may contact the top surface of the substrate 8, and may be laterally spaced from the contact-level dielectric layer 70 by the fifth tubular insulating spacer 74E.

Each horizontally-extending portion of a metallic electrode layer (10A, 20A, 10B, 20B) may laterally extend parallel to the top surface of the substrate 8. As such, each horizontally-extending portion of a metallic electrode layer (10A, 20A, 10B, 20B) may be vertically spaced (distally-spaced) from the substrate 8 by a respective uniform vertical distance from the substrate 8. Thus, cylindrical sidewalls within each metallic electrode layer (10A, 20A, 10B, 20B) may be vertically spaced from the substrate 8 by a same vertical distance. For example, the first cylindrical sidewall of the third metallic electrode layer 10B and the second cylindrical sidewall of the third metallic electrode layer 10B may be located within a horizontally-extending portion of the third metallic electrode layer 10B, and may be vertically spaced from the substrate 8 by a same vertical distance. Put another way, the horizontally-extending portion of the second metallic electrode layer 20A may be more distal from the substrate than the horizontally-extending portion of the first metallic electrode layer 10A.

In one embodiment, each contact assembly {(74A, 80A), (74B, 80B), (74C, 80C), (74D, 80D)} that contacts a respective metallic electrode layer (10A, 20A, 10B, 20B) may be located between a neighboring pair of deep trenches 9 selected from the plurality of deep trenches 9. For example, the first contact assembly (74A, 80A) and the second contact assembly (74B, 80B) may vertically extend into, and through, a horizontally-extending portion of the third metallic electrode layer 10B and a horizontally-extending portion of the fourth metallic electrode layer 20B that are located between a neighboring pair of deep trenches 9 selected from the plurality of deep trenches 9.

In one embodiment, the top surfaces of the contact via structures 80 and the top surfaces of the tubular insulating spacers 74 may be located within the horizontal plane including the top surface of the dielectric hard mask layer 72. Each of the tubular insulating spacers 74 may comprise a respective straight cylindrical outer sidewall that extends vertically from the top surface of the dielectric hard mask layer 72 to a horizontal surface of a respective one of the metallic electrode layers (10A, 20A, 10B, 20B).

Generally, each of the tubular insulating spacers 74 may comprise a respective straight cylindrical outer sidewall that extends vertically at least from the top surface of the contact-level dielectric layer 70 to a horizontal surface of a respective one of the metallic electrode layers (10A, 20A, 10B, 20B). For example, the first tubular insulating spacer 74A comprises a straight cylindrical outer sidewall that extends vertically at least from the top surface of the contact-level dielectric layer 70 to the horizontal surface of the first metallic electrode layer 10A. The second tubular insulating spacer 74B comprises a straight cylindrical outer sidewall that extends vertically at least from the top surface of the contact-level dielectric layer 70 to the horizontal surface of the second metallic electrode layer 20A. The third tubular insulating spacer 74C comprises a straight cylindrical outer sidewall that extends vertically at least from the top surface of the contact-level dielectric layer 70 to the horizontal surface of the third metallic electrode layer 10B. The fourth tubular insulating spacer 74D comprises a straight cylindrical outer sidewall that extends vertically at least from the top surface of the contact-level dielectric layer 70 to the horizontal surface of the fourth metallic electrode layer 20B.

In embodiments in which the dielectric hard mask layer 72 is present, a straight cylindrical outer sidewall of each tubular insulating spacer 74 may have a respective top periphery located within the horizontal plane including the top surface of the dielectric hard mask layer 72. For example, the straight cylindrical outer sidewall of the first tubular insulating spacer 74A may have a top periphery located within the horizontal plane including the top surface of the dielectric hard mask layer 72. Likewise, each of the second, third, fourth, and fifth tubular insulating spacers (74B, 74C, 74D, 74E) may have a straight cylindrical outer sidewall, which has a respective top periphery located within the horizontal plane including the top surface of the dielectric hard mask layer 72.

Figure 10A:
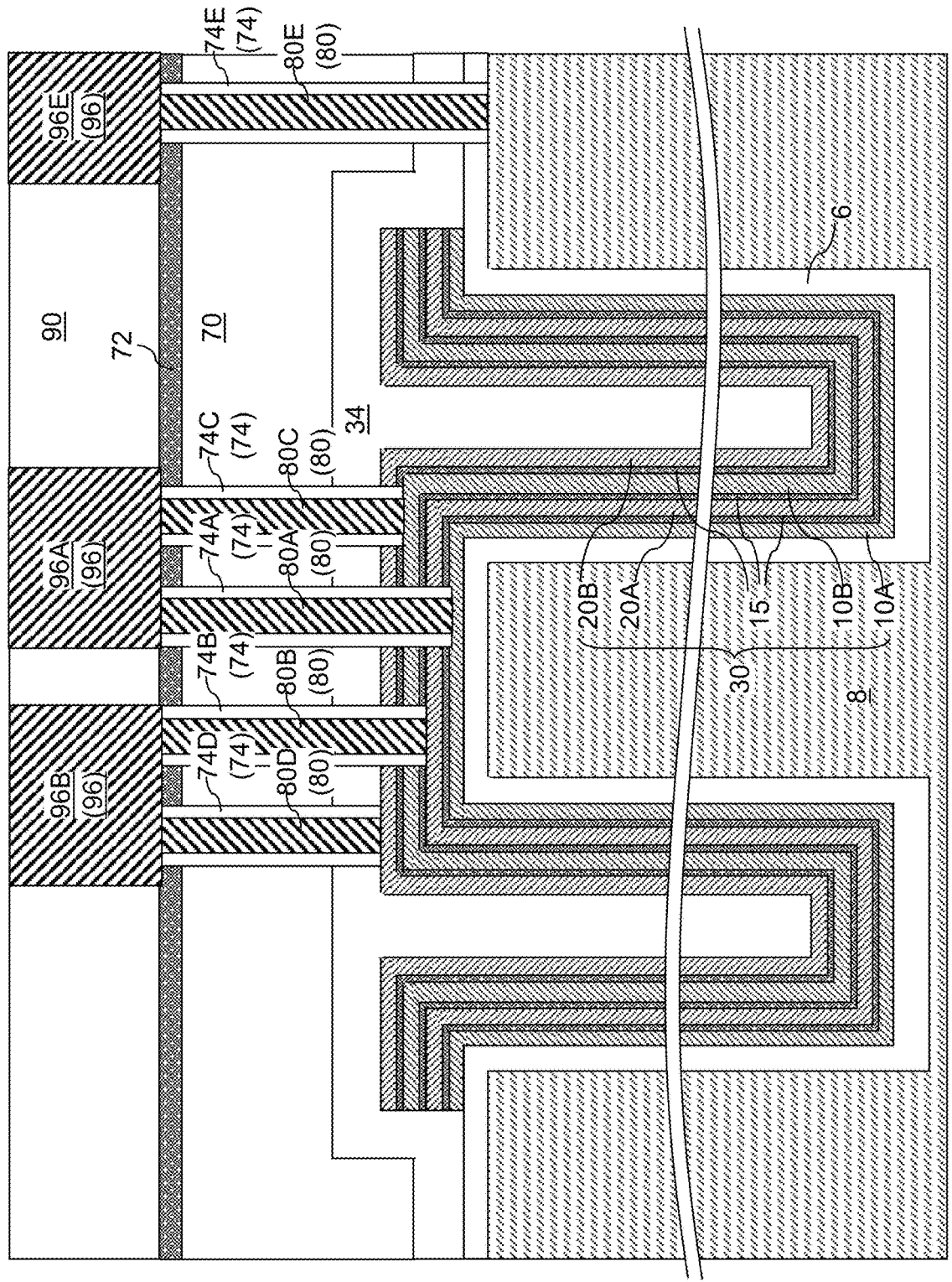
FIG. 10A is a vertical cross-sectional view of the region of the exemplary structure after formation of metal pad structures according to an embodiment of the present disclosure.
Figure 10B:
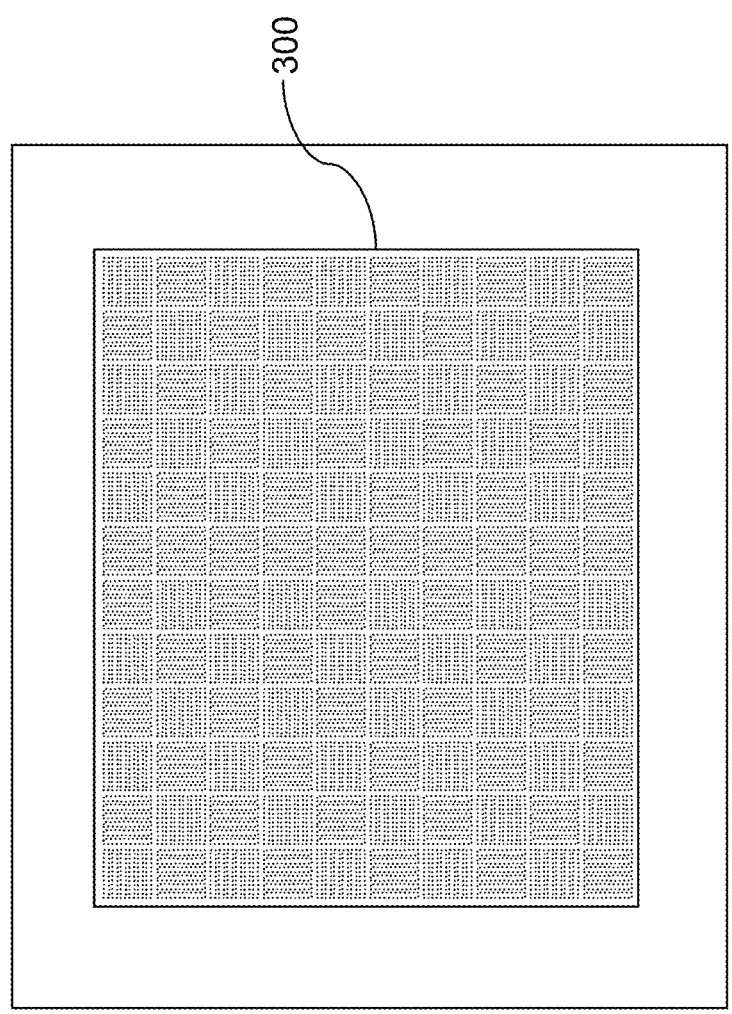
FIG. 10B is a top-down view of the exemplary structure at the processing steps of FIG. 10A

Referring to FIGS. 10A and 10B, an interconnect-level dielectric layer 90 may be formed over the dielectric hard mask layer 72. Pad cavities may be formed in areas that overlie a respective subset of the contact assemblies (74, 80). At least one conductive fill material (such as at least one metallic material) may be deposited in the pad cavities to form various metal pad structures 96. In an illustrative example, the metal pad structures 96 may include a first metal pad structure 96A contacting the first contact assembly (74A, 80A) and the third contact assembly (74C, 80C), a second metal pad structure 96B contacting the second contact assembly (74B, 80B) and the fourth contact assembly (74D, 80D), and a third metal pad structure 96E contacting the fifth contact assembly (74E, 80E).

In one embodiment, the first metal pad structure 96A may be embedded in the interconnect-level dielectric layer 90, and may contact a top surface of the first contact via structure 80A, a top surface of the third contact via structure 80C, an annular top surface of the first tubular insulating spacer 74A, and an annular top surface of the third tubular insulating spacer 74C. The second metal pad structure 96B may be embedded in the interconnect-level dielectric layer 90, and may contact a top surface of the second contact via structure 80B, a top surface of the fourth contact via structure 80D, an annular top surface of the second tubular insulating spacer 74B, and an annular top surface of the fourth tubular insulating spacer 74D. The third metal pad structure 96E may be embedded in the interconnect-level dielectric layer 90, and may contact a top surface of the fifth contact via structure 80E and may contact an annular top surface of the fifth tubular insulating spacer 74E.

Optionally, additional dielectric material layers (not shown) and additional metal interconnect structures (not shown) may be formed over the interconnect-level dielectric layer 90 as needed. Bonding structures such as copper bonding pads and/or copper bonding pillar structures may be formed over the additional metal interconnect structures as known in the art. Subsequently, the exemplary structure may be diced into a plurality of semiconductor dies, which may be a capacitor die that may be attached to another semiconductor die. Each semiconductor die may include a deep trench capacitor 300. The deep trench capacitors 300 may include contact assemblies (74, 80) that are configured to minimize the horizontally-extending portions of the metallic electrode layers typically associated with deep trench capacitors.

Figure 11:
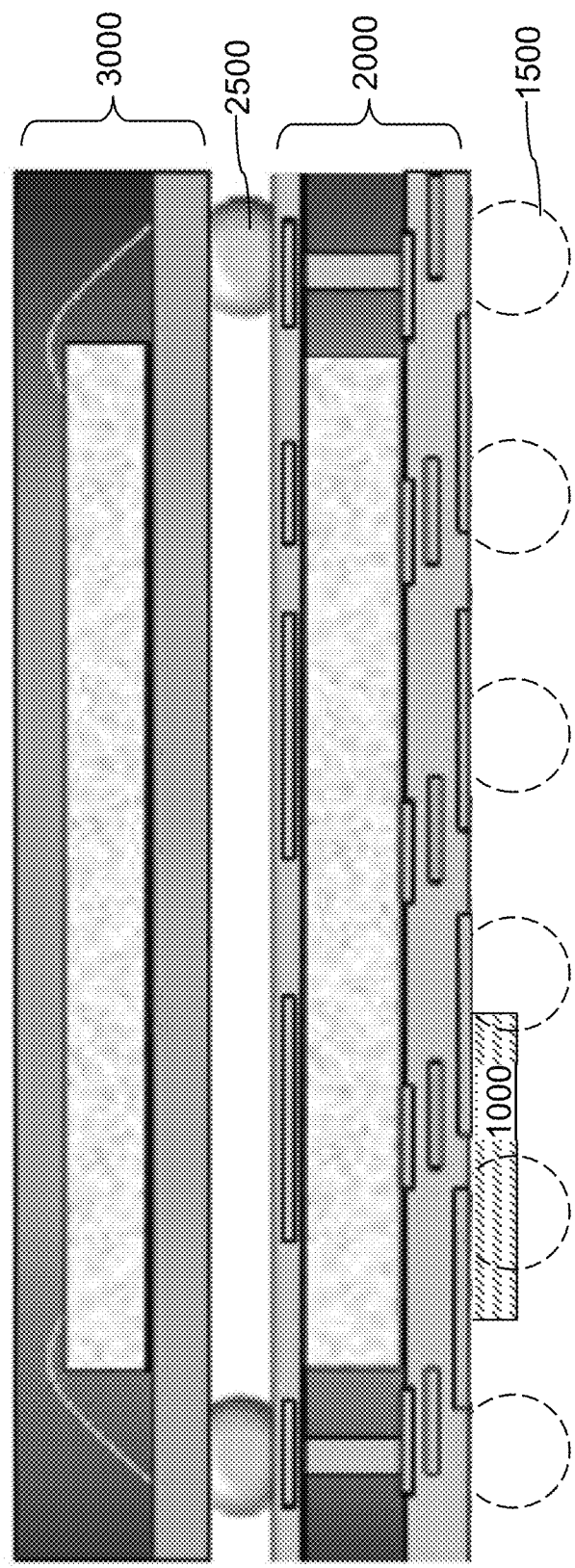
FIG. 11 is a vertical cross-sectional view of an exemplary chip assembly incorporating a semiconductor die containing a deep trench capacitor according to an embodiment of the present disclosure.

Referring to FIG. 11, a non-limiting exemplary application of the semiconductor die derived from the exemplary structure is illustrated. A first semiconductor die 1000 may be provided by performing the processing steps of FIGS. 1A-10B. The first semiconductor die 1000 may be attached to the bottom side of a second semiconductor die 2000. For example, the second semiconductor die 2000 may be a system-on-a-chip (SoC) die 2000, which may be bonded to an integrated fan-out package on package (InFO PoP) die 3000 via an array of solder balls 2500. The second semiconductor die 2000 may be bonded to another module, such as a printed circuit board (PCB) via another array of solder balls 1500. The deep trench capacitor(s) in the semiconductor die 1000 may be used to stabilize the power supply system in the second semiconductor die 2000.

Generally, a first semiconductor die 1000 including a semiconductor substrate 8, a layer stack 30, and a dielectric fill material layer 34 may be provided. A second semiconductor die 2000 including semiconductor devices therein may be provided. The first semiconductor die 1000 may be bonded to the second semiconductor die 2000 through bonding pads or solder material portions.

While the present disclosure is described employing an embodiment in which four metallic electrode layers are employed, embodiments are expressly contemplated herein in which the total number of metallic electrode layers is three, five, six, seven, eight, nine, ten, or more than ten. Generally, at least three metallic electrode layers can be employed. The total number of the node dielectric layers 15 can be accordingly adjusted. For example, the total number of the node dielectric layers 15 can be one less than the total number of metallic electrode layers, and may be two, three, four, five, six, seven, eight, nine, or ten or more. Generally, at least two node dielectric layers 15 can be employed.

Referring to all drawings and according to various embodiments of the present disclosure, a deep trench capacitor 300 is provided, which comprises: at least one deep trench 9 extending downward from a top surface of a substrate 8; a layer stack 30 including at least three metallic electrode layers (10A, 20A, 10B, 20B) interlaced with at least two node dielectric layers 15 and continuously extending over the top surface of the substrate 8 and into each of the at least one deep trench 9, wherein the at least three metallic electrode layers (10A, 20A, 10B, 20B) comprise a first metallic electrode layer 10A, a second metallic electrode layer 20A, and a third metallic electrode layer 10B in an order of proximity from the substrate 8; a contact-level dielectric layer 70 overlying the substrate and the layer stack 30; and a first contact assembly (74A, 80A) vertically extending through the contact-level dielectric layer 70 and including a first tubular insulating spacer 74A laterally surrounding a first contact via structure 80A that contacts a horizontal surface of the first metallic electrode layer 10A, wherein the first tubular insulating spacer 74A contacts a first cylindrical sidewall of the second metallic electrode layer 20A and a first cylindrical sidewall of the third metallic electrode layer 10B.

In one embodiment, the deep trench capacitor may further include a second contact assembly (74B, 80B) including a second tubular insulating spacer 74B laterally surrounding a second contact via structure 80B that contact a horizontal surface of the second metallic electrode layer 20A, wherein the second tubular insulating spacer 74B contact a second cylindrical sidewall of the third metallic electrode layer 10B. In one embodiment, the first cylindrical sidewall of the third metallic electrode layer 10B and the second cylindrical sidewall of the third metallic electrode layer 10B are located within a horizontally-extending portion of the third metallic electrode layer 10B, and are vertically spaced from the substrate by a same vertical distance. In one embodiment, the at least one deep trench 9 comprises a plurality of deep trenches 9; the layer stack 30 comprises a plurality of vertically-extending portions that extend into a respective deep trench 9 selected from the plurality of deep trenches; and the first contact assembly (74A, 80A) and the second contact assembly (74B, 80B) vertically extend into a horizontally-extending portion of the third metallic electrode layer 10B located between a neighboring pair of deep trenches selected from the plurality of deep trenches.

In one embodiment, the at least two node dielectric layers 15 comprise a first node dielectric layer and a second node dielectric layer in an order of proximity from the substrate 8; and the first tubular insulating spacer 74A contacts a cylindrical sidewall of the first node dielectric layer and a cylindrical sidewall of the second node dielectric layer. In one embodiment, the layer stack 30 includes a fourth metallic electrode layer 20B that is more distal from the substrate 8 than the third metallic electrode layer 10B is from the substrate 8; and the first tubular insulating spacer 74A contacts a first cylindrical sidewall of the fourth metallic electrode layer 10B. In one embodiment, the first tubular insulating spacer 74A comprises a straight cylindrical outer sidewall that extends vertically at least from a top surface of the contact-level dielectric layer 70 to the horizontal surface of the first metallic electrode layer 10A. In one embodiment, the deep trench capacitor 300 may also include a dielectric hard mask layer 72 overlying the contact-level dielectric layer 70, wherein the straight cylindrical outer sidewall of the first tubular insulating spacer 74A has a top periphery located within a horizontal plane including a top surface of the dielectric hard mask layer 72. In one embodiment, the deep trench capacitor 300 may also include an interconnect-level dielectric layer 90 overlying the dielectric hard mask layer 72; and a first metal pad structure 96 embedded in the interconnect-level dielectric layer 90 and contacting a top surface of the first contact via structure 80A and contacting an annular top surface of the first tubular insulating spacer 74A. In one embodiment, sidewalls of all layers within a horizontally-extending portion of the layer stack 30 that overlie the substrate 8 are vertically coincident with one another. In one embodiment, the deep trench capacitor 300 may also include a dielectric fill material layer 34 including at least one vertically-extending portion that extends into the at least one deep trench 9 and a horizontally-extending portion that overlies a horizontally-extending portion of the layer stack 30, wherein vertical sidewalls of the dielectric fill material layer 34 contacts a respective one of the sidewalls of the layers within the horizontally-extending portion of the layer stack 30.

According to another aspect of the present disclosure, a bonded assembly comprising a first semiconductor die 1000 and a second semiconductor die 2000 is provided. The first semiconductor die 1000 comprises a semiconductor substrate 8 and a deep trench capacitor 300 embedded within the semiconductor substrate 8. The deep trench capacitor 300 comprises: at least one deep trench 9 extending downward from a top surface of the semiconductor substrate 8; a layer stack 30 including at least three metallic electrode layers (10A, 20A, 10B, 20B) interlaced with at least two node dielectric layers 15 and continuously extending over the top surface of the semiconductor substrate 8 and into each of the at least one deep trench 9, wherein the at least three metallic electrode layers (10A, 20A, 10B, 20B) comprise a first metallic electrode layer 10A, a second metallic electrode layer 20A, and a third metallic electrode layer 10B in an order of proximity from the semiconductor substrate 8; a contact-level dielectric layer 70 overlying the semiconductor substrate 8 and the layer stack 30; and a first contact assembly (74A, 80A) vertically extending through the contact-level dielectric layer 70 and including a first tubular insulating spacer 74A laterally surrounding a first contact via structure 80A that contacts a horizontal surface of the first metallic electrode layer 10A, wherein the first tubular insulating spacer 74A contacts a first cylindrical sidewall of the second metallic electrode layer 20A and a first cylindrical sidewall of the third metallic electrode layer 10B. The second semiconductor die 2000 is bonded to the first semiconductor die 1000, and comprises semiconductor devices therein. The deep trench capacitor is electrically connected to the semiconductor devices through bonding pads or solder material portions.

In one embodiment, the first semiconductor die 1000 includes a second contact assembly 74B, 80B including a second tubular insulating spacer 74B laterally surrounding a second contact via structure 80B that contacts a horizontal surface of the second metallic electrode layer 20A; the second tubular insulating spacer 74B contacts a second cylindrical sidewall of the third metallic electrode layer 10B; and the first contact assembly 74A, 80A and the second contact assembly 74B, 80B vertically extend into a horizontally-extending portion of the third metallic electrode layer 10B.

In one embodiment, the second semiconductor die 2000 comprises a system-on-a-chip (SoC) die; and the first semiconductor die 1000 has a lesser horizontal cross-sectional area than the second semiconductor die 2000.

Figure 12:
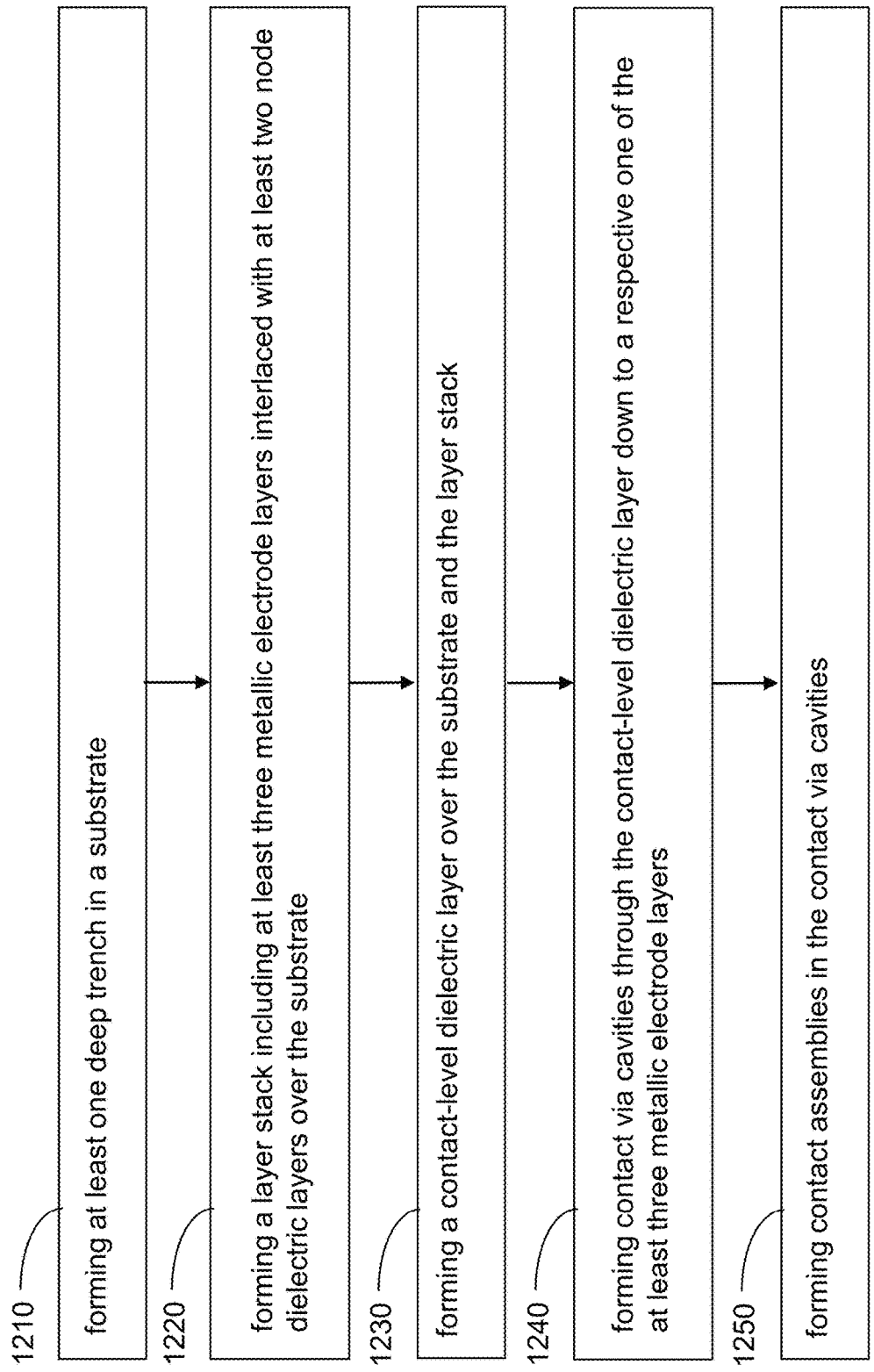
FIG. 12 is a flowchart that illustrates the general processing steps of the methods of the present disclosure.

FIG. 12 is a flowchart that illustrates the general processing steps for forming a semiconductor structure including at least one deep trench capacitor according to an aspect of the present disclosure. Referring to step 1210 and FIGS. 1A and 1B, at least one deep trench 9 may be formed in a substrate 8. Referring to step 1220 and FIGS. 2 and 3, a layer stack 30 including at least three metallic electrode layers (10A, 20A, 10B, 20B) interlaced with at least two node dielectric layers 15 may be formed over the substrate 8. The layer stack 30 continuously extends into the at least one deep trench 9, and a cavity is present in an unfilled volume of the at least one deep trench 9. Referring to step 1230 and FIG. 4, a contact-level dielectric layer 70 may be formed over the substrate 8 and the layer stack 30. Referring to step 1240 and FIGS. 5-8, contact via cavities 79 are formed through the contact-level dielectric layer 70 down to a respective one of the at least three metallic electrode layers (10A, 20A, 10B, 20B). Referring to step 1250 and FIGS. 9-10B, contact assemblies (74, 80) are formed in the contact via cavities 79. Each of the contact assemblies (74, 80) comprises a respective tubular insulating spacer 74 and a respective contact via structure 80 that is laterally surrounded by the respective tubular insulating spacer 74. A first contact assembly (74A, 80A) selected from the contact assemblies (74, 80) comprises a first tubular insulating spacer 74A that is formed directly on a first cylindrical sidewall of the second metallic electrode layer 20A and directly on a first cylindrical sidewall of the third metallic electrode layer 10B.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deep trench capacitor comprising:
a first deep trench and a second deep trench each extending downward from a top surface of a substrate that is located within a first horizontal plane;
a layer stack including at least three metallic electrode layers interlaced with at least two node dielectric layers, wherein each layer within the layer stack continuously extends over the top surface of the substrate and into each of the first deep trench and the second deep trench, wherein the at least three metallic electrode layers comprise a first metallic electrode layer, a second metallic electrode layer, and a third metallic electrode layer in an order of proximity from the substrate, wherein a topmost surface of the layer stack is located entirely within a second horizontal plane that overlies the first horizontal plane;
a dielectric fill material layer comprising:
a first horizontally-extending portion that is located within an area of an outer periphery of the topmost surface of the layer stack and is located entirely above the second horizontal plane and laterally extends over entire areas of the first deep trench and the second deep trench;
a first vertically-extending portion that vertically extends from the horizontally-extending portion into a central volume of the first deep trench;
a second vertically-extending portion that vertically extends from the horizontally-extending portion into a central volume of the second deep trench; and
a second horizontally-extending portion that is located outside a region in which the layer stack is present and vertically recessed relative to the first horizontally-extending portion,
wherein the topmost surface of the layer stack comprises a surface segment which laterally extends between, and is laterally bounded by, a top edge of the first vertically-extending portion of the dielectric fill material layer and a top edge of the second vertically-extending portion of the dielectric fill material layer and located entirely within the second horizontal plane,
wherein an entirety of the surface segment of the topmost surface of the layer stack is in contact with the first horizontally-extending portion of the dielectric fill material layer within the second horizontal plane;
a contact-level dielectric layer overlying the substrate, the layer stack, and the dielectric fill material layer and having a horizontal top surface that extends over the first horizontally-extending portion and the second horizontally-extending portion of the dielectric fill material layer;
a first contact assembly vertically extending through the contact-level dielectric layer and the first horizontally-extending portion of the dielectric fill material layer, located entirely within an area of said surface segment of the topmost surface of the layer stack, and including a first tubular insulating spacer laterally surrounding a first contact via structure that contacts a horizontal surface of the first metallic electrode layer, wherein the first tubular insulating spacer contacts a first cylindrical sidewall of the first horizontally-extending portion of the dielectric fill material layer, a first cylindrical sidewall of the second metallic electrode layer, and a first cylindrical sidewall of the third metallic electrode layer;
a second contact assembly vertically extending through the contact-level dielectric layer and the first horizontally-extending portion of the dielectric fill material layer, located entirely within the area of said surface segment of the topmost surface of the layer stack, and including a second tubular insulating spacer laterally surrounding a second contact via structure that contacts a horizontal surface of the third metallic electrode layer, wherein the second tubular insulating spacer contacts a second cylindrical sidewall of the first horizontally-extending portion of the dielectric fill material layer; and a first metal pad structure comprising a bottom surface that contacts a top surface of the first contact via structure and a top surface of the second contact via structure.

2. The deep trench capacitor of claim 1, further comprising a third contact assembly located entirely within the area of said surface segment of the topmost surface of the layer stack and including a third tubular insulating spacer laterally surrounding a third contact via structure that contacts a horizontal surface of the second metallic electrode layer, wherein the third tubular insulating spacer contacts a second cylindrical sidewall of the third metallic electrode layer.

3. The deep trench capacitor of claim 2, wherein the first cylindrical sidewall of the third metallic electrode layer and the second cylindrical sidewall of the third metallic electrode layer are located within a horizontally-extending portion of the third metallic electrode layer, and are vertically spaced from the substrate by a same vertical distance.

4. The deep trench capacitor of claim 2, wherein:
the layer stack includes a fourth metallic electrode layer that is more distal from the substrate than the third metallic electrode layer is from the substrate; and
the first tubular insulating spacer contacts a first cylindrical sidewall of the fourth metallic electrode layer.

5. The deep trench capacitor of claim 4, further comprising:
a fourth contact assembly vertically extending through the contact-level dielectric layer, located entirely within the area of said surface segment of the topmost surface of the layer stack, and including a fourth tubular insulating spacer laterally surrounding a fourth contact via structure that contacts a horizontal surface of the fourth metallic electrode layer; and
a second metal pad structure comprising a bottom surface that contacts a top surface of the third contact via structure and a top surface of the fourth contact via structure.

6. The deep trench capacitor of claim 1, wherein:
the at least two node dielectric layers comprise a first node dielectric layer and a second node dielectric layer in an order of proximity from the substrate; and
the first tubular insulating spacer contacts a cylindrical sidewall of the first node dielectric layer and a cylindrical sidewall of the second node dielectric layer.

7. The deep trench capacitor of claim 1, wherein the first tubular insulating spacer comprises a straight cylindrical outer sidewall that extends vertically at least from a top surface of the contact-level dielectric layer to the horizontal surface of the first metallic electrode layer.

8. The deep trench capacitor of claim 7, further comprising a dielectric hard mask layer overlying the contact-level dielectric layer, wherein the straight cylindrical outer sidewall of the first tubular insulating spacer has a top periphery located within a horizontal plane including a top surface of the dielectric hard mask layer.

9. The deep trench capacitor of claim 8, further comprising:
an interconnect-level dielectric layer overlying the dielectric hard mask layer; and
the first metal pad structure is embedded in the interconnect-level dielectric layer and contacting a top surface of the first contact via structure and contacting an annular top surface of the first tubular insulating spacer.

10. The deep trench capacitor of claim 1, wherein sidewalls of all layers within a horizontally-extending portion of the layer stack that overlie the substrate are vertically coincident with one another.

11. The deep trench capacitor of claim 10, wherein vertical sidewalls of the dielectric fill material layer contact a respective one of the sidewalls of the layers within the horizontally-extending portion of the layer stack.

12. A bonded assembly comprising a first semiconductor die and a second semiconductor die, wherein:
the first semiconductor die comprises a semiconductor substrate and a deep trench capacitor embedded within the semiconductor substrate;
the deep trench capacitor comprises:
a first deep trench and a second deep trench each extending downward from a top surface of a substrate that is located within a first horizontal plane;
a layer stack including at least three metallic electrode layers interlaced with at least two node dielectric layers, wherein each layer within the layer stack continuously extends over the top surface of the substrate and into each of the first deep trench and the second deep trench, wherein the at least three metallic electrode layers comprise a first metallic electrode layer, a second metallic electrode layer, and a third metallic electrode layer in an order of proximity from the substrate, wherein a topmost surface of the layer stack is located entirely within a second horizontal plane that overlies the first horizontal plane;
a dielectric fill material layer comprising:
a first horizontally-extending portion that is located within an area of an outer periphery of the topmost surface of the layer stack and is located entirely above the second horizontal plane and laterally extends over entire areas of the first deep trench and the second deep trench;
a first vertically-extending portion that vertically extends from the horizontally-extending portion into a central volume of the first deep trench;
a second vertically-extending portion that vertically extends from the horizontally-extending portion into a central volume of the second deep trench; and
a second horizontally-extending portion that is located outside a region in which the layer stack is present and vertically recessed relative to the first horizontally-extending portion,
wherein the topmost surface of the layer stack comprises a surface segment which laterally extends between, and is laterally bounded by, a top edge of the first vertically-extending portion of the dielectric fill material layer and a top edge of the second vertically-extending portion of the dielectric fill material layer and located entirely within the second horizontal plane,
wherein an entirety of the surface segment of the topmost surface of the layer stack is in contact with the first horizontally-extending portion of the dielectric fill material layer within the second horizontal plane;
a contact-level dielectric layer overlying the substrate, the layer stack, and the dielectric fill material layer and having a horizontal top surface that extends over the first horizontally-extending portion and the second horizontally-extending portion of the dielectric fill material layer;
a first contact assembly vertically extending through the contact-level dielectric layer and the first horizontally-extending portion of the dielectric fill material layer, located entirely within an area of said surface segment of the topmost surface of the layer stack, and including a first tubular insulating spacer laterally surrounding a first contact via structure that contacts a horizontal surface of the first metallic electrode layer, wherein the first tubular insulating spacer contacts a first cylindrical sidewall of the first horizontally-extending portion of the dielectric fill material layer, a first cylindrical sidewall of the second metallic electrode layer, and a first cylindrical sidewall of the third metallic electrode layer;
a second contact assembly vertically extending through the contact-level dielectric layer and the first horizontally-extending portion of the dielectric fill material layer, located entirely within the area of said surface segment of the topmost surface of the layer stack, and including a second tubular insulating spacer laterally surrounding a second contact via structure that contacts a horizontal surface of the third metallic electrode layer, wherein the second tubular insulating spacer contacts a second cylindrical sidewall of the first horizontally-extending portion of the dielectric fill material layer; and
a first metal pad structure comprising a bottom surface that contacts a top surface of the first contact via structure and a top surface of the second contact via structure; and
the second semiconductor die is bonded to the first semiconductor die and comprises semiconductor devices therein, wherein the deep trench capacitor is electrically connected to the semiconductor devices through bonding pads or solder material portions.

13. The bonded assembly of claim 12, wherein:
the first semiconductor die comprises a third contact assembly located entirely within the area of said surface segment of the topmost surface of the layer stack and including a third tubular insulating spacer laterally surrounding a third contact via structure that contacts a horizontal surface of the second metallic electrode layer;
the third tubular insulating spacer contacts a second cylindrical sidewall of the third metallic electrode layer; and
the first contact assembly and the third contact assembly vertically extend into a horizontally-extending portion of the third metallic electrode layer.

14. The bonded assembly of claim 12, wherein:
the second semiconductor die comprises a system-on-a-chip (SoC) die; and
the first semiconductor die has a lesser horizontal cross-sectional area than the second semiconductor die.

15. A deep trench capacitor comprising:
a plurality of deep trenches extending downward from a top surface of a substrate that is located within a first horizontal plane and comprising groups of first-type deep trenches each having a greater first lateral extent along a first horizontal direction than along a second horizontal direction, and further comprising groups of second-type deep trenches each having a greater second lateral extent along the second horizontal direction than along the first horizontal direction, wherein the plurality of deep trenches comprises a neighboring pair of deep trenches that includes a first deep trench and a second deep trench without any intervening deep trench therebetween;
a layer stack including at least three metallic electrode layers interlaced with at least two node dielectric layers, wherein each layer within the layer stack continuously extends over the top surface of the substrate and into each of the first-type deep trench and the second-type deep trench, wherein the at least three metallic electrode layers comprise a first metallic electrode layer, a second metallic electrode layer, and a third metallic electrode layer in an order of proximity from the substrate, wherein a topmost surface of the layer stack is located entirely within a second horizontal plane that overlies the first horizontal plane;

a dielectric fill material layer comprising:
- a first horizontally-extending portion that is located within an area of an outer periphery of the topmost surface of the layer stack and is located entirely above the second horizontal plane and laterally extends over entire areas of the first deep trench and the second deep trench;
- a first vertically-extending portion that vertically extends from the horizontally-extending portion into a central volume of the first deep trench;
- a second vertically-extending portion that vertically extends from the horizontally-extending portion into a central volume of the second deep trench; and
- a second horizontally-extending portion that is located outside a region in which the layer stack is present and vertically recessed relative to the first horizontally-extending portion,
  - wherein the topmost surface of the layer stack comprises a surface segment which laterally extends between, and is laterally bounded by, a top edge of the first vertically-extending portion of the dielectric fill material layer and a top edge of the second vertically-extending portion of the dielectric fill material layer and located entirely within the second horizontal plane,
  - wherein an entirety of the surface segment of the topmost surface of the layer stack is in contact with the first horizontally-extending portion of the dielectric fill material layer within the second horizontal plane;

a contact-level dielectric layer overlying the substrate, the layer stack, and the dielectric fill material layer and having a horizontal top surface that extends over the first horizontally-extending portion and the second horizontally-extending portion of the dielectric fill material layer;

a first contact assembly vertically extending through the contact-level dielectric layer and the first horizontally-extending portion of the dielectric fill material layer, located entirely within an area of said surface segment of the topmost surface of the layer stack, and including a first tubular insulating spacer laterally surrounding a first contact via structure that contacts a horizontal surface of the first metallic electrode layer, wherein the first tubular insulating spacer contacts a first cylindrical sidewall of the first horizontally-extending portion of the dielectric fill material layer, a first cylindrical sidewall of the second metallic electrode layer, and a first cylindrical sidewall of the third metallic electrode layer;

a second contact assembly vertically extending through the contact-level dielectric layer and the first horizontally-extending portion of the dielectric fill material layer, located entirely within the area of said surface segment of the topmost surface of the layer stack, and including a second tubular insulating spacer laterally surrounding a second contact via structure that contacts a horizontal surface of the third metallic electrode layer, wherein the second tubular insulating spacer contacts a second cylindrical sidewall of the first horizontally-extending portion of the dielectric fill material layer; and a first metal pad structure comprising a bottom surface that contacts a top surface of the first contact via structure and a top surface of the second contact via structure.

16. The deep trench capacitor of claim 15, further comprising a third contact assembly located entirely within the area of said surface segment of the topmost surface of the layer stack and including a third tubular insulating spacer laterally surrounding a third contact via structure that contacts a horizontal surface of the second metallic electrode layer, wherein the third tubular insulating spacer contacts a second cylindrical sidewall of the third metallic electrode layer.

17. The deep trench capacitor of claim 16, wherein the first cylindrical sidewall of the third metallic electrode layer and the second cylindrical sidewall of the third metallic electrode layer are located within a horizontally-extending portion of the third metallic electrode layer, and are vertically spaced from the substrate by a same vertical distance.

18. The deep trench capacitor of claim 15, wherein:
the groups of first-type deep trenches are arranged in a pattern of a first two-dimensional array;
the groups of second-type deep trenches are arranged in a pattern of a second two-dimensional array; and
the second two-dimensional array is interlaced with the first two-dimensional array.

19. The deep trench capacitor of claim 18, wherein:
each neighboring pair of groups of first-type deep trenches is laterally spaced from each other by a respective group of second deep trenches; and
each neighboring pair of groups of second-type deep trenches is laterally spaced from each other by a respective group of first deep trenches.

20. The deep trench capacitor of claim 15, wherein:
the layer stack includes a fourth metallic electrode layer that is more distal from the substrate than the third metallic electrode layer is from the substrate;
the first tubular insulating spacer contacts a first cylindrical sidewall of the fourth metallic electrode layer; and
the deep trench capacitor further comprises:
- a third contact assembly vertically extending through the contact-level dielectric layer, located entirely within the area of said surface segment of the topmost surface of the layer stack, and including a fourth tubular insulating spacer laterally surrounding a fourth contact via structure that contacts a horizontal surface of the fourth metallic electrode layer; and
- a second metal pad structure comprising a bottom surface that contacts a top surface of the third contact via structure and a top surface of the fourth contact via structure.

* * * * *